United States Patent
Jeon et al.

(10) Patent No.: US 8,373,245 B2
(45) Date of Patent: Feb. 12, 2013

(54) 2DEG SCHOTTKY DIODE FORMED IN NITRIDE MATERIAL WITH A COMPOSITE SCHOTTKY/OHMIC ELECTRODE STRUCTURE AND METHOD OF MAKING THE SAME

(75) Inventors: Woo Chul Jeon, Suwon-si (KR); Jung Hee Lee, Daegu-si (KR); Young Hwan Park, Seoul (KR); Ki Yeol Park, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 357 days.

(21) Appl. No.: 12/654,940

(22) Filed: Jan. 8, 2010

(65) Prior Publication Data

US 2011/0057234 A1 Mar. 10, 2011

(30) Foreign Application Priority Data

Sep. 8, 2009 (KR) .................. 10-2009-0084597

(51) Int. Cl.
*H01L 29/47* (2006.01)

(52) U.S. Cl. ........ 257/471; 257/485; 257/162; 257/141; 257/343; 257/459; 257/452; 257/476; 257/478; 257/194; 257/183

(58) Field of Classification Search .................. 257/471, 257/485, 162, 141, 343, E27.04, E29.014, 257/E33.065–E33.068, E33.051, E51.009, 257/459, 452, 476, 478, 194, 183, E29.012, 257/E31.074

See application file for complete search history.

(56) References Cited

U.S. PATENT DOCUMENTS

| | | | | |
|---|---|---|---|---|
| 7,898,004 | B2 * | 3/2011 | Wu et al. | 257/194 |
| 8,076,699 | B2 * | 12/2011 | Chen et al. | 257/194 |
| 2003/0098462 | A1 * | 5/2003 | Yoshida | 257/183 |
| 2011/0057234 | A1 * | 3/2011 | Jeon et al. | 257/194 |

FOREIGN PATENT DOCUMENTS

| | | |
|---|---|---|
| KR | 10-2006-0093428 | 8/2006 |
| KR | 10-2006-0110002 | 10/2006 |

OTHER PUBLICATIONS

Korean Office Action issued Jan. 7, 2011 in corresponding Korean Patent Application No. 10-2009-0084597.

\* cited by examiner

*Primary Examiner* — Michael Shingleton

(57) ABSTRACT

Disclosed is a semiconductor device including: a base substrate; a semiconductor layer disposed on the base substrate; an ohmic electrode part which has ohmic electrode lines disposed in a first direction, on the semiconductor layer; and a Schottky electrode part which is disposed to be spaced apart from the ohmic electrode lines on the semiconductor layer and includes Schottky electrode lines disposed in the first direction, wherein the Schottky electrode lines and the ohmic electrode lines are alternately disposed in parallel, and the ohmic electrode part further includes first ohmic electrodes covered by the Schottky electrode lines on the semiconductor layer.

7 Claims, 22 Drawing Sheets

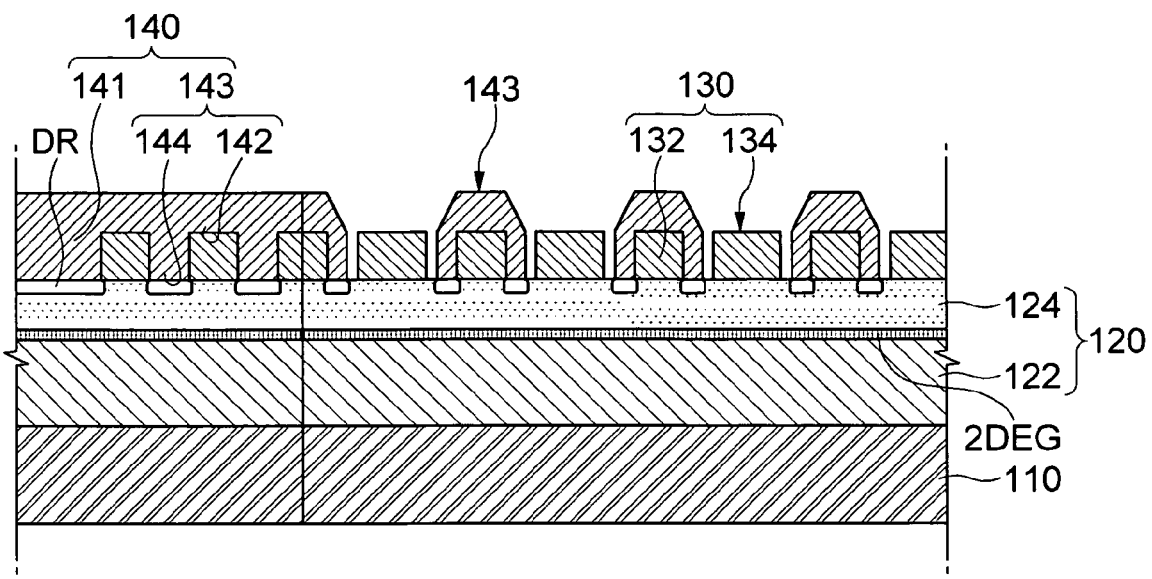

2DEG SCHOTTKY DIODE FORMED IN NITRIDE MATERIAL WITH A COMPOSITE SCHOTTKY/OHMIC ELECTRODE STRUCTURE AND METHOD OF MAKING THE SAME

CROSS-REFERENCE TO RELATED APPLICATIONS

This application claims the benefit of Korean Patent Application No. 10-2009-0084597 filed with the Korea Intellectual Property Office on Sep. 8, 2009, the disclosure of which is incorporated herein by reference.

BACKGROUND OF THE INVENTION

1. Field of the Invention

The present invention relates to a semiconductor device; and, more particularly, to a semiconductor device having a Schottky diode structure, and a method for manufacturing the same.

2. Description of the Related Art

In general, an active device of semiconductor devices is used to configure a circuit, such as an amplifier, a voltage regulator, a current regulator, an oscillator, a logic gate, and so on. A diode of active devices is widely used as a detecting device, a rectifying device, and a switching device. As for a typical diode, a voltage regulator diode, a variable capacitance diode, a photo diode, a Light Emitting Diode (LED), a zener diode, a gunn diode, a Schottky diode, and so on are exemplified.

The Schottky diode of the exemplified diodes uses Schottky junction generated when a metal comes into contact with semiconductor. The Schottky diode can implement high-speed switching operation and low forward voltage driving. The nitride-based semiconductor device like the Schottky diode has a Schottky contact as an anode electrode, and an ohmic contact as a cathode electrode. However, in the Schottky diode with such a structure, there exists a trade-off relation between satisfaction of low on-voltage and on-current and reduction of a reverse leakage current. Thus, it is difficult to develop a nitride-based semiconductor device capable of operating at a low on-voltage and reducing a reverse leakage current.

SUMMARY OF THE INVENTION

The present invention has been proposed in order to overcome the above-described problems and it is, therefore, an object of the present invention to provide a semiconductor device operable at a low on-voltage and a method for manufacturing the same.

Further, another object of the present invention is to provide a semiconductor device for reducing a reverse leakage current and a method for manufacturing the same.

Further, another object of the present invention is to provide a semiconductor device for increasing a breakdown current and a method for manufacturing the same.

Further, another object of the present invention is to provide a semiconductor device having a high forward current and a method for manufacturing the same.

In accordance with one aspect of the present invention to achieve the object, there is provided a semiconductor device including: a base substrate; a semiconductor layer disposed on the base substrate; an ohmic electrode part which has ohmic electrode lines disposed in a first direction, on the semiconductor layer; and a Schottky electrode part which is disposed to be spaced apart from the ohmic electrode lines on the semiconductor layer and includes Schottky electrode lines disposed in the first direction, wherein the Schottky electrode lines and the ohmic electrode lines are alternately disposed in parallel, and the ohmic electrode part further includes first ohmic electrodes covered by the Schottky electrode lines on the semiconductor layer.

The ohmic electrode part further includes an ohmic electrode plate connected to each one end of the ohmic electrode lines, and the Schottky electrode part further comprises a Schottky electrode plate connected to each one end of the Schottky electrode lines, and one of the Schottky electrode lines is disposed between two of the ohmic electrode lines to thereby achieve an interdigited configuration in which the ohmic electrode part and the Schottky electrode part are formed.

The first ohmic electrodes include a plurality of ohmic contact pillars with an island-shaped cross section, and the ohmic contact pillars are engaged with the Schottky electrode lines with one another up and down to thereby achieve a prominence and depression structure.

The ohmic electrode part further includes first ohmic electrodes covered by the Schottky electrode lines on the semiconductor layer, and the first ohmic electrodes include ohmic contact pillars disposed in the first direction.

The semiconductor layer is provided to generate a 2-Dimensional Electron Gas (2DEG) within the semiconductor layer, and the semiconductor layer includes: a first nitride film which is disposed on the base substrate, and has a GaN; and a second nitride film which is disposed on the first nitride film and has an AlGaN.

The semiconductor layer includes: a lower layer adjacent to the base substrate; and an upper layer having a lower impurity concentration than that of the lower layer, and the semiconductor device further comprises a second semiconductor layer which is disposed on the upper layer and has a higher impurity concentration than that of the upper layer.

Protrusions protruded upward are further provided on the upper layer, and the second semiconductor layer is disposed on the protrusions.

The Schottky electrode part includes: first bonding portions bonded to the first ohmic electrodes; and second bonding portions bonded to the semiconductor layer of regions between the first ohmic electrodes and the ohmic electrode lines.

The semiconductor layer includes: a first nitride film disposed on the base substrate; and a second nitride film which is disposed on the first nitride film and has a higher energy band than that of the first nitride film, and the second bonding portions of the Schottky electrode part are extended to inside of the second nitride film and are disposed to be spaced apart from the first nitride film.

The semiconductor layer includes: a first nitride film disposed on the base substrate; and a second nitride film which is disposed on the first nitride film and has a higher energy band than that of the first nitride film, and the second bonding portions of the Schottky electrode part are extended to inside of the first nitride film through the second nitride film.

The semiconductor layer includes: a first nitride film disposed on the base substrate; and a second nitride film which is disposed on the first nitride film and has higher energy band than that of the first nitride film, and the ohmic electrode part is extended to inside of the second nitride film and is disposed to be spaced apart from the first nitride film.

The semiconductor layer includes: a first nitride film disposed on the base substrate; and a second nitride film which is disposed on the first nitride film and has a higher energy band than that of the first nitride film, and the ohmic electrode part is extended to inside of the second nitride film through the first nitride film.

The semiconductor device further includes field plates disposed on the semiconductor layer between the ohmic electrode lines and the Schottky electrode lines.

Each of the field plates has one side portion covered by the ohmic electrode part and the other side portion covered by the Schottky electrode part.

In accordance with other aspect of the present invention to achieve the object, there is provided a semiconductor device including: a base substrate; a semiconductor layer disposed on the base substrate; an ohmic electrode part which has ohmic electrode lines and first ohmic electrodes disposed on the semiconductor layer; and a Schottky electrode part having Schottky electrode lines which cover the first ohmic electrodes and are disposed in parallel to the ohmic electrode lines, wherein a depletion region is provided to be spaced apart from a 2DEG when the semiconductor device is driven at an on-voltage, and is provided to be expanded to the 2DEG when the semiconductor device is driven at an off-voltage, the 2DEG being generated when the semiconductor layer is bonded to the Schottky electrode part.

The ohmic electrode lines and the Schottky electrode lines are alternatively disposed to thereby achieve an interdigited configuration in which the ohmic electrode part and the Schottky electrode part are formed.

The first ohmic electrodes include a plurality of ohmic contact pillars with an island-shaped cross section, and the ohmic contact pillars and the Schottky electrode lines are engaged with one another to thereby achieve a prominence and depression structure.

The first ohmic electrodes include ohmic electrode lines disposed in a longitudinal direction of the ohmic electrode lines.

The semiconductor layer is provided to generate a 2-DEG to inside thereof, and the semiconductor layer includes: a first nitride film which is disposed on the base substrate and has a GaN; and a second nitride film which is disposed on the first nitride film and has an AlGaN.

The semiconductor layer includes: a lower layer adjacent to the base substrate; an upper layer having a lower impurity concentration than that of the lower layer, and the semiconductor device further comprises a second semiconductor layer which is disposed on the upper layer and has a higher impurity concentration than that of the upper layer.

When the semiconductor device is driven at a forward voltage equal to or higher than an on-voltage of the Schottky electrode part, the depletion region is provided to permit a current flow to the ohmic electrode lines from the Schottky electrode part.

When the semiconductor device is driven at a forward voltage lower than the on-voltage of the Schottky electrode part, the depletion region is provided to block a current flow to the ohmic electrode lines from the Schottky electrode part.

When the semiconductor device is driven at a reverse voltage, the depletion region is provided to block a current flow to the ohmic electrode lines from the first ohmic electrodes.

In accordance with other aspect of the present invention to achieve the object, there is provided a method for manufacturing a semiconductor device including the steps of: preparing a base substrate; forming a semiconductor layer on the base substrate; forming an ohmic electrode part having ohmic electrode lines, on the semiconductor layer; and forming a Schottky electrode part, which is disposed on the semiconductor layer to be spaced apart from the ohmic electrode lines and has Schottky electrode lines parallel to the ohmic electrode lines.

The step of forming the ohmic electrode part further comprises a step of forming an ohmic electrode plate connected to one end of the ohmic electrode lines, and the step of forming the Schottky electrode part further comprises a step of forming a Schottky electrode plate connected one end of the Schottky electrode lines, and one line of the Schottky electrode lines is disposed between two of the ohmic electrode lines to thereby achieve an interdigited configuration in which the ohmic electrode part and the Schottky electrode part are formed.

The step of forming the ohmic electrode lines and the ohmic electrode plate is made through an in-situ scheme, and the step of forming the Schottky electrode lines and the Schottky electrode plate is made through the in-situ scheme.

The step of forming the semiconductor layer includes the steps of: forming a first nitride film with a GaN on the base substrate; and forming a second nitride film with an AlGaN, on the first nitride film.

The step of forming the semiconductor layer includes the steps of: forming a lower layer having a high impurity concentration, on the base substrate; and forming an upper layer with a lower impurity concentration than that of the lower layer, on the lower layer.

The method further includes a step of forming a second semiconductor layer between the semiconductor layer and the first ohmic electrodes, wherein the step of forming the second semiconductor layer comprises a step of forming a semiconductor film with a higher impurity concentration than that of the upper layer of the semiconductor layer.

The step of forming the ohmic electrode part includes the steps of: forming recesses in the semiconductor layer by selectively etching a partial region of the semiconductor layer; and forming a first metal film formed with a material different from that of the Schottky electrode part, on the recesses.

The step of forming the Schottky electrode part includes the steps of: forming recesses on the semiconductor layer by selectively etching a partial region of the semiconductor layer; and forming a second metal film formed with a material different from that of the ohmic electrode part, on the recesses.

The method further includes a step of forming field plates on a region of the semiconductor layer between the ohmic electrode part and the Schottky electrode part.

The method further includes a step of forming first ohmic electrodes covered by the Schottky electrode lines, on the semiconductor layer.

The step of forming the first ohmic electrodes includes a step of forming a plurality of ohmic contact pillars with an island-shaped cross section, on the semiconductor layer between the ohmic electrode lines.

The step of forming the first ohmic electrodes includes a step of forming the ohmic contact lines parallel to the ohmic electrode lines, on the semiconductor layer between the ohmic electrode lines.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 4A to 4C are views showing methods for manufacturing the semiconductor device 100 in accordance with one embodiment of the present invention, respectively;

DETAILED DESCRIPTION OF THE PREFERABLE EMBODIMENTS

Figure 1:
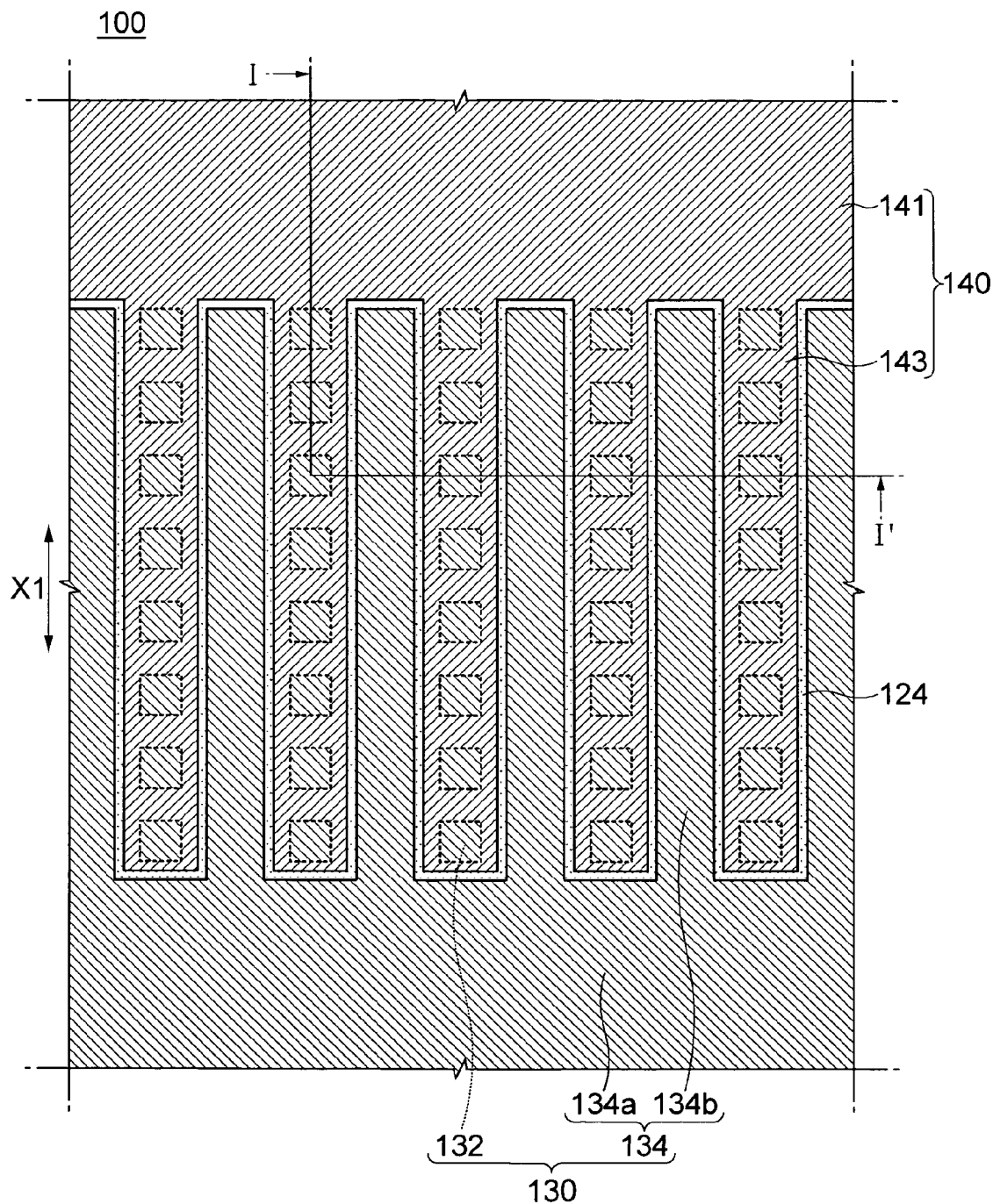
FIG. 1 is a view showing a semiconductor device in accordance with one embodiment of the present invention.

The invention now will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Preferred embodiments of the invention will be described below with reference to cross-sectional views, which are exemplary drawings of the invention. The exemplary drawings may be modified by manufacturing techniques and/or tolerances. Accordingly, the preferred embodiments of the invention are not limited to specific configurations shown in the drawings, and include modifications based on the method of manufacturing the semiconductor device. For example, an etched region shown at a right angle may be formed in the rounded shape or formed to have a predetermined curvature. Therefore, regions shown in the drawings have schematic characteristics. In addition, the shapes of the regions shown in the drawings exemplify specific shapes of regions in an element, and do not limit the invention.

Hereinafter, a detailed description will be given of a semiconductor device and a method for manufacturing the same in accordance with embodiments of the present invention, with reference to accompanying drawings.

Figure 2:
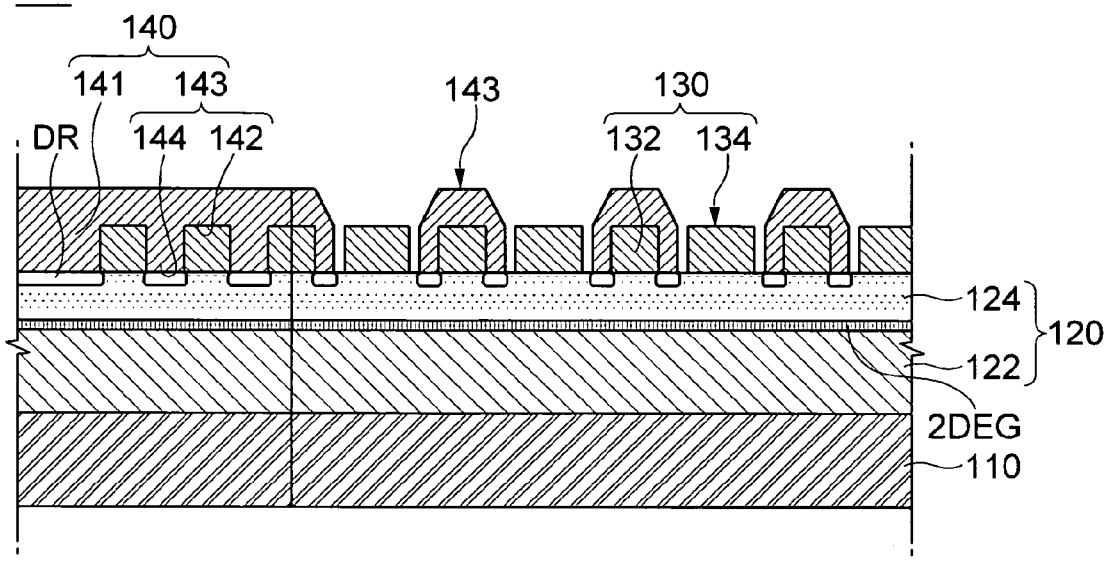
FIG. 2 is a cross-sectional view taken along a line I-I' of FIG. 1.

FIG. 1 is a plane-view showing a semiconductor device in accordance with one embodiment of the present invention, and FIG. 2 is a cross-sectional view taken along a line I-I' of FIG. 1.

Referring to FIGS. 1 and 2, the semiconductor device 100 may include a base substrate 110, a semiconductor layer 120, an ohmic electrode part 130, and a Schottky electrode part 140.

The base substrate 110 may be a plate used for formation of the semiconductor device having a Schottky diode structure. For example, the base substrate 110 may be a semiconductor substrate. As for the base substrate 110, at least one of a silicon substrate, a silicon carbide substrate, and a sapphire substrate may be exemplified.

The semiconductor layer 120 may be disposed on the base substrate 110. For example, the semiconductor layer 120 may include a first nitride film 122 and a second nitride film 124 which are sequentially stacked on the base substrate 110. The second nitride film 124 may be formed of a material having an energy band gap wider than that of the first nitride film 122. In addition, the second nitride film 124 may be formed of a material having a lattice parameter different from that of the first nitride film 122. For example, the first nitride film 122 and the second nitride film 124 may be films which contain a III-nitride-based material. In particular, the first nitride film 122 and the second nitride film 124 may be formed of any one of GaN, AlGaN, InGaN, and InAlGaN. For example, the first nitride film 122 may be a gallium nitride film, and the second nitride film 124 may be an aluminium gallium nitride film. Herein, the first nitride film 122 of the semiconductor layer 120 is formed of P-type GaN having high resistivity, thereby reducing a leakage current of the semiconductor device 100.

In the semiconductor layer 120 with the above-described structure, a 2-Dimensional Electron Gas (2DEG) may be generated on the boundary of the first nitride film 122 and the second nitride film 124. When the semiconductor device 100 is operated, a current flows through the 2DEG. Meanwhile, a buffering film (not shown) may be further provided between the base substrate 110 and the first nitride film 122 so as to solve problems caused by lattice mismatch generated between the base substrate 110 and the first nitride film 122.

The ohmic electrode part 130 may be disposed on the second nitride film 124. For example, the ohmic electrode part 130 may include the first and second ohmic electrodes 132 and 134. The second ohmic electrodes 134 may include an ohmic electrode plate 134*a* and ohmic electrode lines 134*b*. The first ohmic electrodes 132 may include at least one of ohmic contact pillars with an island-shaped cross section. For example, the first ohmic electrodes 132 are composed of a plurality of ohmic contact pillars, and the ohmic contact pillars may be disposed to be spaced at a predetermined space in a longitudinal direction of the ohmic electrode lines 134*b* (hereinafter, referred to as "X1"). The ohmic electrode plate 134*a* may mostly have a rectangular-plate shape. The ohmic electrode lines 134*b* may have a line shape extended toward the first direction X1 from one side of the ohmic electrode plate 134*a*. In addition, the ohmic electrode lines 134*b* may be disposed to be spaced in parallel to one another at a predetermined space.

The Schottky electrode part 140 may be disposed on the semiconductor layer 120 in such a manner to be opposite to the ohmic electrode part 130. The Schottky electrode part 140 may include a Schottky electrode plate 141 and Schottky electrode lines 143. The Schottky electrode plate 141 may mostly have a rectangular-plate shape. The Schottky electrode plate 141 may be disposed to be spaced apart from the second ohmic electrodes 134 with respect to the first ohmic electrodes 132 interposed therebetween, on the second nitride film 124. The Schottky electrode lines 143 may have a line shape extended toward the ohmic electrode plate 134*a* from one surface of the Schottky electrode plate 141 facing the ohmic electrode plate 134*a*. Herein, any one of the Schottky electrode lines 143 may be disposed to be interposed between two ohmic electrode lines 134*b*. In addition, the Schottky electrode lines 143 may be provided to cover the first ohmic electrodes 132. Thus, the Schottky electrode part 140 may have first bonding portions 142 and second bonding portions 144, wherein the first bonding portions 142 are bonded to a top surface of the first ohmic electrodes 132 and the second bonding portions 144 are bonded to a top surface of the semiconductor layer 120. A depletion region DR may be generated within the semiconductor layer 120 adjacent to the second bonding portions 144.

Meanwhile, the ohmic electrode part 130 and the Schottky electrode part 140 may be formed of various materials. Specifically, the ohmic electrode part 130 may be formed of the same metallic material, and the Schottky electrode part 140 is formed of metallic material different from those of the ohmic electrode part 130. In this case, the ohmic electrode part 130 is formed of a metallic material composed of at least one metal element of Au, Ni, Pt, Ti, Al, Pd, Ir, Rh, Co, W, Mo, Ta, Cu, and Zn. On the contrary, the Schottky electrode part 140 is formed of a metallic material composed of metal elements different from any one of the above-described metal elements. Specifically, the first ohmic electrodes 132 and the Schottky electrode lines 143 are electrically connected, but made of different materials.

The semiconductor device 100 with the same structure may have a configuration in which the ohmic electrode lines 134*b* are engaged with the Schottky electrode lines 143 on the semiconductor layer 120. In addition, the Schottky electrode part 140 covers the ohmic contact pillars of the first ohmic electrodes 132, thereby achieving a prominence and depression structure in which the Schottky electrode part 140 is engaged with the first ohmic electrodes 132 up and down.

Also, in the semiconductor device 100 with the same structure, each of the first ohmic electrodes 132 is bonded to the second nitride film 124 on a lower part of the Schottky electrode lines 143 to thereby come into ohmic contact with the second nitride film 124. The second ohmic electrodes 134 are bonded to the second nitride film 124 between the ohmic electrode lines 134*b* to thereby come into ohmic contact with the second nitride film 124. The Schottky electrode part 140 may include the first bonding portions 142 and the second bonding portions 144, wherein the first bonding portions 142 are bonded to the first ohmic electrodes 132 to thereby come into ohmic contact with the first ohmic electrodes 132, and the second bonding portions 144 are bonded to the second nitride film 124 to thereby come into Schottky contact with the second nitride film 124. In this case, the Schottky electrode part 140 bonded to the first ohmic electrodes 132 is used as an anode electrode, and the ohmic electrode part 130, specifically, the second ohmic electrodes 134 including an ohmic electrode plate 134*a* and ohmic electrode lines 134*b*, are used as a cathode electrode.

As described above, the semiconductor device 100 is provided to be in an interdigited configuration in which a part of the ohmic electrode part 130 and the Schottky electrode part 140 is interdigited with each other, thereby increasing currents per unit-area between the ohmic electrode part 130 and the Schottky electrode part 140. Thus, the semiconductor device 100 can increase forward currents, thereby improving operation speed and power converting efficiency of the device. Also, the semiconductor device 100 may be provided with the Schottky electrode part 140 composed of a plurality of the ohmic contact pillars with an island-shaped cross section, on a region where the Schottky electrode part 140 is formed, thereby reducing a reverse leakage current when driven at a reverse voltage.

Continuously, a detailed description will be given of various operation states of the semiconductor device in accordance with one embodiment of the present invention having been described with reference to FIGS. 1 and 2.

Figure 3A:
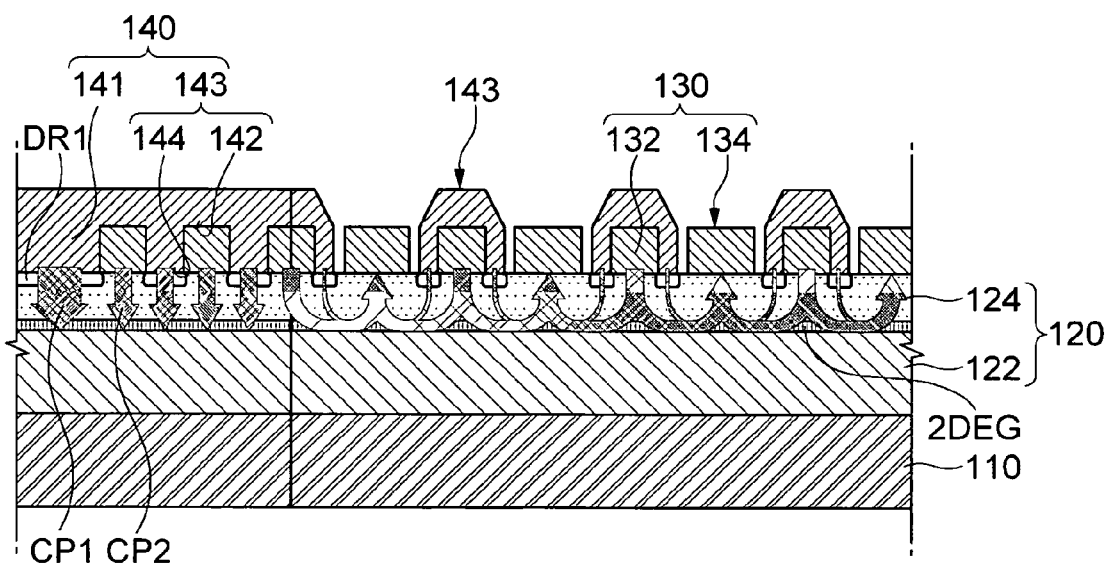
FIGS. 3A to 3C are views showing operation states of the semiconductor device shown in FIG. 1, respectively.
Figure 3B:
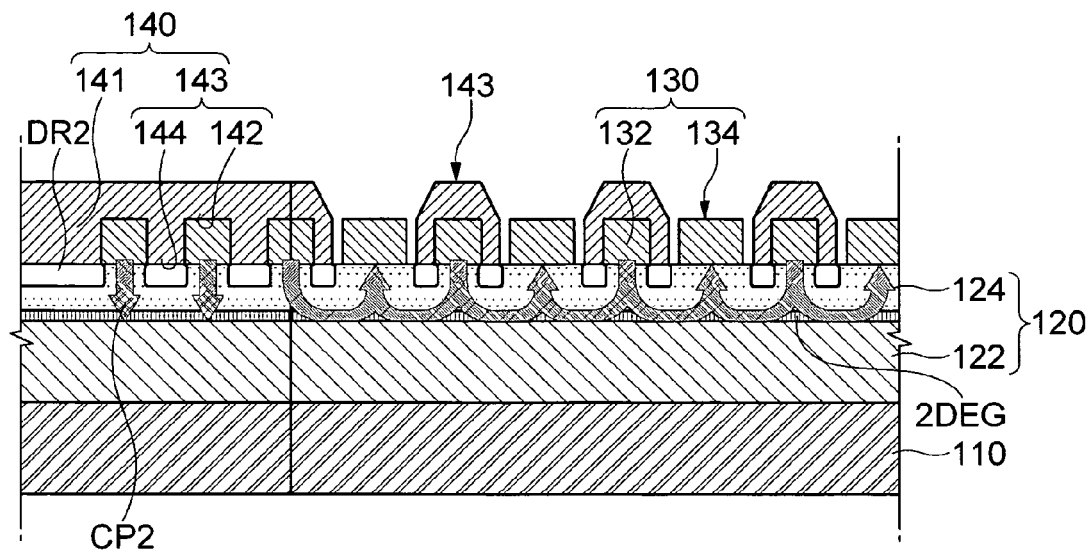
Figure 3C:
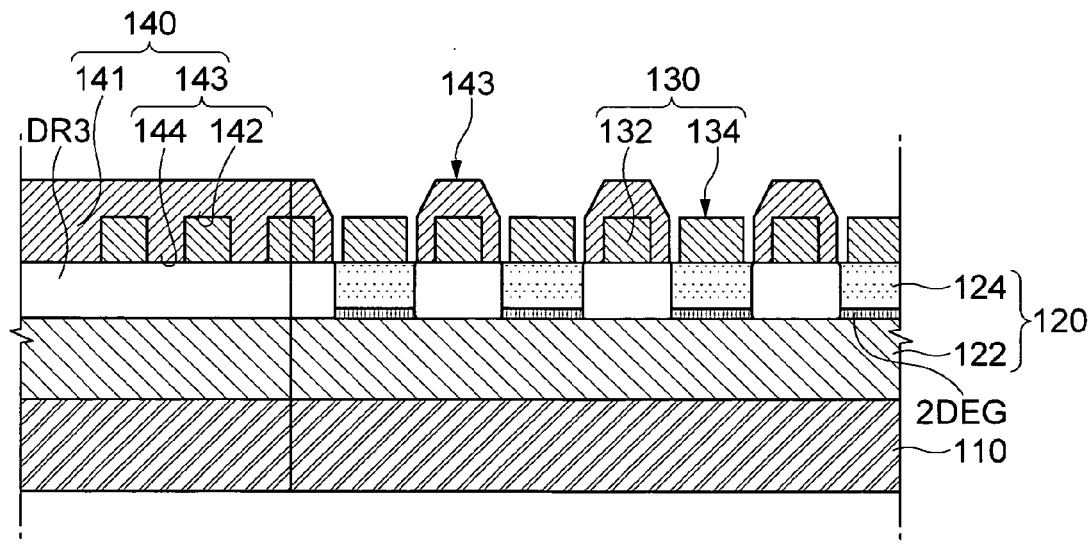

FIGS. 3A to 3C are views showing operation states of the semiconductor device shown in FIG. 1, respectively. FIG. 3A is a view showing an operation state of the semiconductor device when driven at a forward voltage equal to or higher than an on-voltage of the Schottky diode. Referring to FIG. 3A, when the semiconductor device 100 in accordance with one embodiment of the present invention is driven at a first forward voltage equal to or higher than the on-voltage of the Schottky diode, a depletion region (DR1) generated where the second semiconductor layer 120 and the Schottky electrode part 140 are joined together may be relatively reduced. Thus, in the semiconductor device 100, a current may flow through a first current path CP1 and a second current path CP2, wherein the first current path CP1 passes through the 2DEG from the Schottky electrode part 140, and the second current path CP2 passes through the 2DEG from the first ohmic electrodes 132. In this case, since forward currents of the semiconductor device 100 are increased, it is possible to operate the semiconductor device 100 even at a low on-voltage.

FIG. 3B is a view showing an operation state of the semiconductor device when driven at a forward voltage lower than an on-voltage of the Schottky diode. Referring to FIG. 3B, when the semiconductor device 100 in accordance with one embodiment of the present invention is driven at a second forward voltage lower than the on-voltage of the Schottky diode, a depletion region DR2 generated where the second semiconductor layer 120 and the Schottky electrode part 140 are joined together may be more expanded than the depletion region DR1 corresponding to a case where the semiconductor device 100 is driven at the first forward voltage as described in FIG. 3A. Such the expanded depletion region DR2 may be wide enough to block a current flow between the second semiconductor layer 124 and the Schottky electrode part 140. However, the second forward voltage may be controlled such that the depletion region DR2 fails to be expanded to the 2DEG. Thus, in the semiconductor device 100, a current may flow through the second current path CP2 alone.

FIG. 3C is a view showing an operation state of the semiconductor device when driven at a reverse voltage. Referring to FIG. 3C, when the semiconductor device 100 is driven at the reverse voltage, a depletion region DR3 may be more expanded to the 2DEG than the depletion region DR2 shown in FIG. 3B. Such the depletion region DR3 allows the 2DEG to be disconnected, thereby blocking all current flows passing through the first and second current paths CP1 and the CP2.

As described above, when the semiconductor device 100 is driven in the forward direction, a current may flow to the second ohmic electrodes 134 by the first ohmic electrodes 132 positioned below the Schottky electrode part 140 even in a state where the driving voltage is lower than the on-voltage of the Schottky diode, simultaneously while the current may flow through the first ohmic electrodes 132 and the Schottky electrode part 140 in a state where the driving voltage is higher than the on-voltage of the Schottky diode. Thus, since the semiconductor device 100 may increase forward currents, it can be operated even at a low driving voltage. Also, when the semiconductor device 100 is driven in the reverse direction, the depletion region DR3 generated by the Schottky electrode part 140 allows the 2DEG to be disconnected, thereby stably blocking a current flow.

Hereinafter, a description will be given of a method for manufacturing the semiconductor device in accordance with the embodiment of the present invention. Herein, the repeated description for the semiconductor device will be omitted or simplified.

Figure 4A:
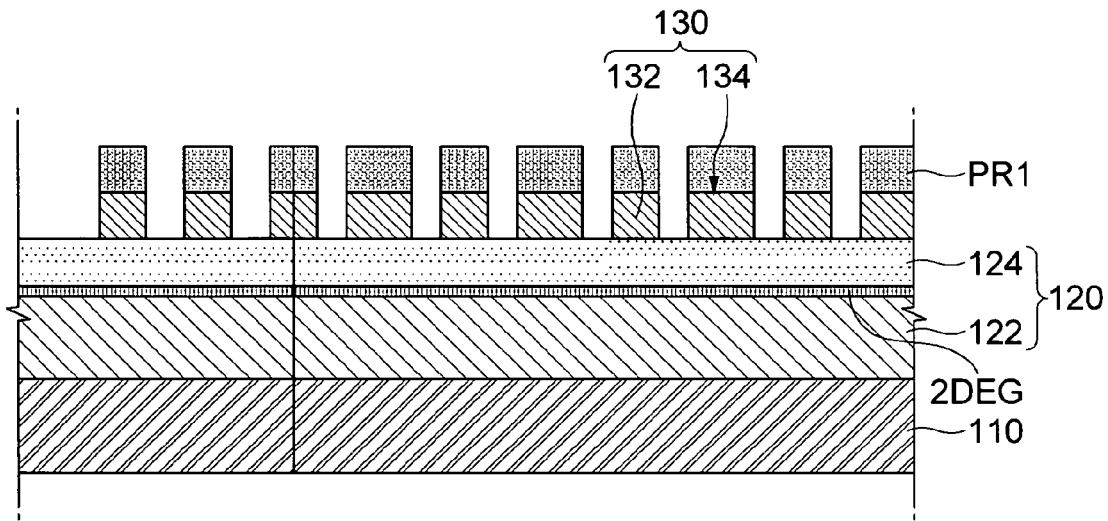
Figure 4B:
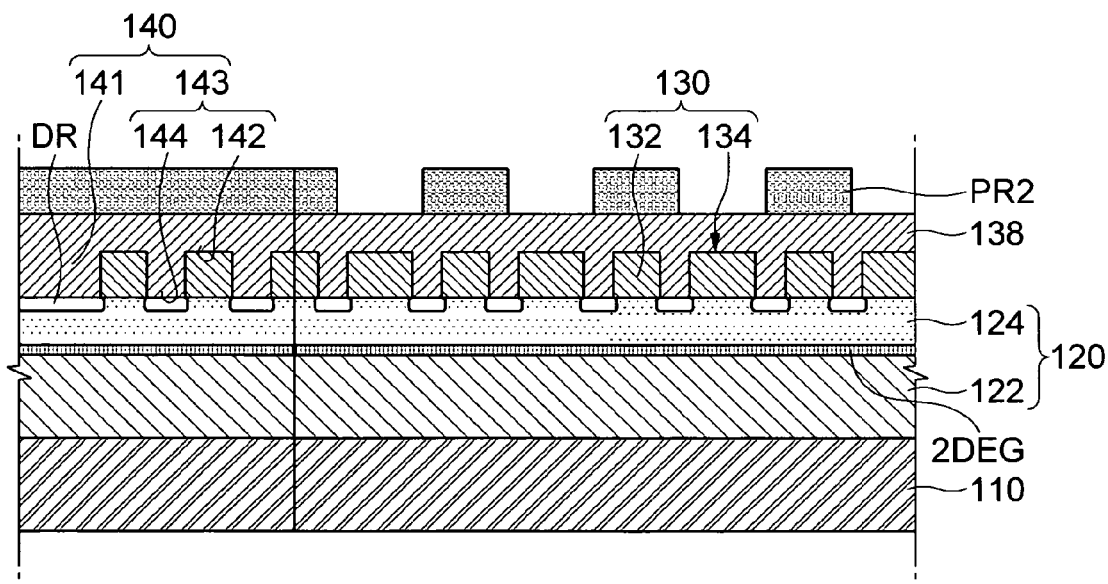

FIGS. 4A to 4C are views showing methods for manufacturing the semiconductor device 100 in accordance with one embodiment of the present invention, respectively.

Referring to FIG. 4A, the base substrate 110 may be prepared. A step of preparing the base substrate 110 may include a step of preparing a semiconductor substrate. The step of preparing the base substrate 110 may include a step of preparing at least one of a silicon substrate, a silicon carbide substrate, and a sapphire substrate.

The semiconductor layer 120 may be formed on the base substrate 110. A step of forming the semiconductor layer 120 may include a step of forming the first nitride film 122 on the base substrate 110, and a step of forming the second nitride film 124 on the first nitride film 122. For example, the step of forming the semiconductor layer 120 may be achieved by epitaxial-growing the first nitride film 122 by using the base substrate 110 as a seed layer, and then epitaxial-growing the second nitride film 124 by using the first nitride film 122 as a seed layer. As for an epitaxial growth process for forming the first and second nitride films 122 and 124, at least one of a molecular beam epitaxial growth process, an atomic layer epitaxial growth process, a flow modulation organometallic vapor phase epitaxial growth process, a flow modulation organometallic vapor phase epitaxial growth process, and a hybrid vapor phase epitaxial growth process may be used.

Furthermore, as for another process for forming the first and second nitride films 122 and 124, at least one of a chemical vapor deposition process and a physical vapor deposition process may be used.

The ohmic electrode part 130 may be formed on the semiconductor layer 120. For example, a first metal film may be formed on the second nitride film 124. A step of forming the first metal film may include a step of forming a metal film, which is composed of at least one of Au, Ni, Pt, Ti, Al, Pd, Ir, Rh, Co, W, Mo, Ta, Cu, and Zn, on the second nitride film 124 in a conformal manner. Thereafter, the ohmic electrode part 130 may be formed on the semiconductor layer 120 by performing an etching process in which the first photoresist pattern PR1 is applied on the first metal film. Thus, the first ohmic electrodes 132 having the ohmic contact pillars, and the second ohmic electrodes 134 having the ohmic electrode plate 134a and the ohmic electrode lines 134b having been described with reference to FIGS. 1 and 2 may be formed on the second nitride film 124. Herein, since the first ohmic electrodes 132 and the second ohmic electrodes 134 are simultaneously formed in the same etching process, they may be formed of the same metallic material. For example, the first ohmic electrodes 132 and the second ohmic electrodes 134 may be simultaneously formed in an in-situ scheme. Meanwhile, a process of planarizing the first metal film may be added before the first metal film is etched. The first photoresist pattern PR1 may be removed after the etching process is performed.

Referring to FIG. 4B, a second metal film 138 which covers all surfaces of the resulting material formed with the ohmic electrode part 130 may be formed. The second metal film 138 may be formed of a metallic film different from that of the ohmic electrode part 130. On the second metal film 138, a second photoresist pattern PR2 may be formed that selectively exposes a part of the second metal film 138.

Referring to FIG. 4C, an exposed part of the second metal film 138 may be etched by using the second photoresist pattern PR2, indicated by reference numeral PR2 of FIG. 4B, as an etching mask. Thus, the Schottky electrode part 140 which entirely covers the first ohmic electrodes 132 may be formed on the second nitride film 124. Thus, a prominence and depression structure where the first ohmic electrodes 132 are engaged with the Schottky electrode part 140 up and down may be made on the central region A1. Herein, the Schottky electrode part 140 may be disposed to be spaced apart from the second ohmic electrodes 134. Thus, a region of the second nitride film 124 between the first ohmic electrodes 132 and the second ohmic electrodes 134 may be exposed. By removing the third photoresist pattern PR3, it is possible to form the semiconductor device 100 as shown in FIGS. 1 and 2.

Hereinafter, a description will be given of various modified examples of the semiconductor device in accordance with embodiments of the present invention. The repeated description for the same components between the above-described semiconductor device and semiconductor devices in accordance with various modified embodiments will be omitted or simplified. Since those skilled in the art can analogize operation processes of the modified examples to be described from the operation states of the semiconductor device having been described with reference to FIGS. 3A and 3C, the description for operation processes of the modified examples will be omitted.

Figure 5:
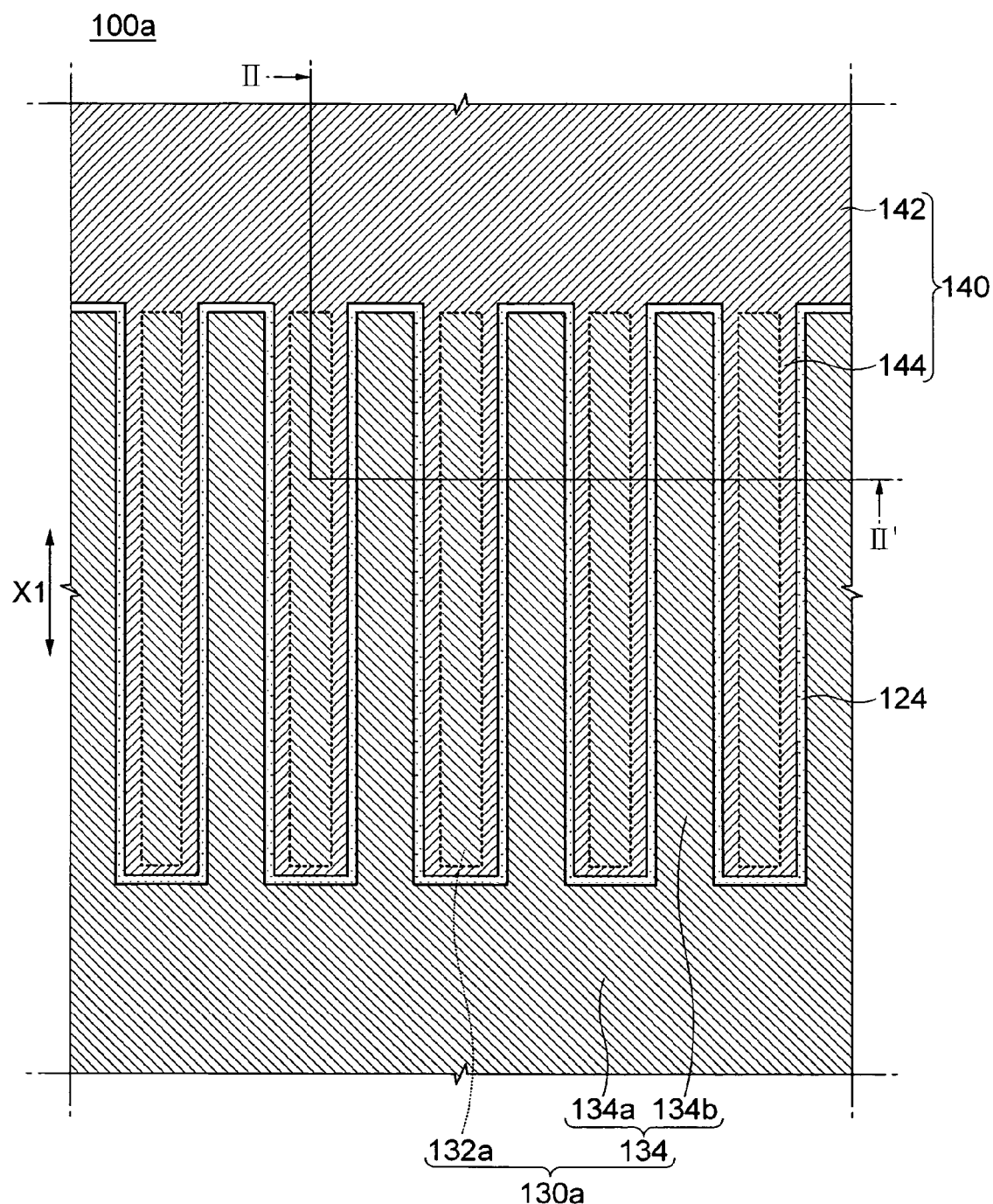
FIG. 5 is a plane-view showing one modified example of the semiconductor device in accordance with one embodiment of the present invention.
Figure 6:
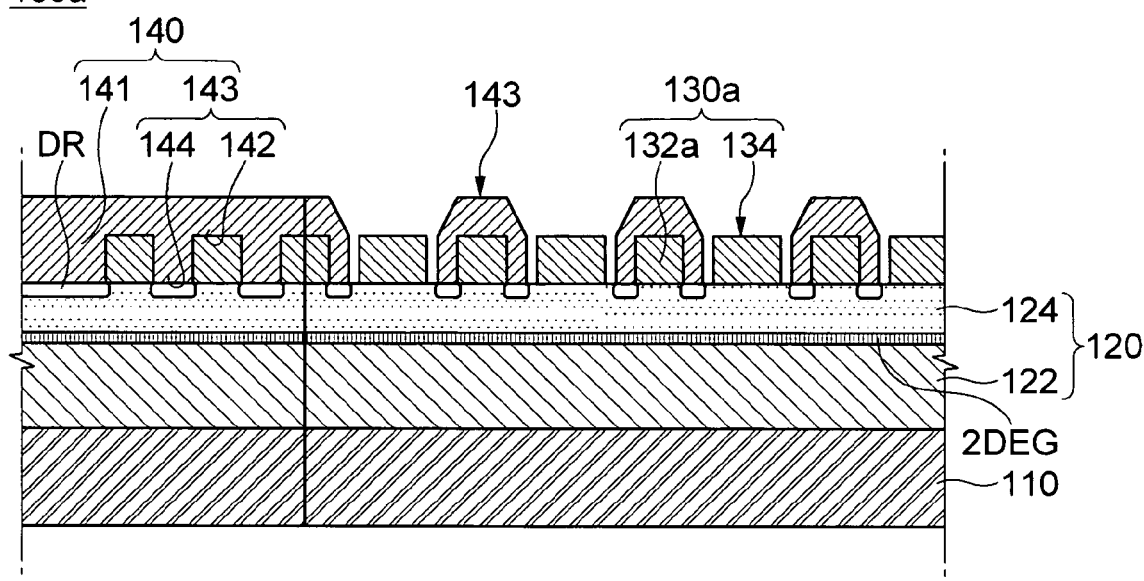
FIG. 6 is a cross-sectional view taken along a line II-II' of FIG. 5.

FIG. 5 is a plane-view showing one modified example of the semiconductor device in accordance with one embodiment of the present invention. FIG. 6 is a cross-sectional view taken along a line II-II' of FIG. 5. Referring to FIGS. 5 and 6, a semiconductor device 100a in accordance with one modified example of the present invention may include a semiconductor layer 120 positioned on the substrate 110, an ohmic electrode part 130*a* positioned on the semiconductor layer 120, and a Schottky electrode part 140. The semiconductor layer may include a first nitride film 122 and a second nitride film 124 which are sequentially stacked on the base substrate 110. A 2-Dimensional Electron Gas (2DEG) may be generated on the boundary of the first nitride film 122 and the second nitride film 124. The ohmic electrode part 130*a* may include the first ohmic electrodes 132*a* and the second ohmic electrodes 134, and the second ohmic electrodes 134 may include the ohmic electrode plate 134*a*, and the ohmic electrode lines 134*b* extended vertically along the first direction X1 from one surface of the ohmic electrode plate 134*a*. Also, the Schottky electrode part 140 may include a Schottky electrode plate 141 disposed to be spaced apart from the ohmic electrode plate 134*a*, and Schottky electrode lines 143 extended vertically along the first direction X1 toward a space between the ohmic electrode lines 134*b* form the Schottky electrode plate 141. Thus, an interdigited configuration may be made where the ohmic electrode lines 134*b* and the Schottky electrode lines 143 are interdigited with one another.

Meanwhile, the first ohmic electrodes 132*a* may be formed to have a line shape. For example, the first ohmic electrodes 132*a* may be disposed along the longitudinal direction of the ohmic electrode lines 134*b* of the second ohmic electrodes 134, that is, the first direction X1. Herein, the first ohmic electrodes 132*a* may be provided to be covered by the Schottky electrode lines 143 of the Schottky electrode part 140. The Schottky electrode part 140 may be disposed to be spaced apart from the ohmic electrode lines 134*b*.

The semiconductor device 100*a* with the same structure may be provided with an ohmic electrode part 130 including first ohmic electrodes 132 with a line shape, in comparison with the semiconductor device 100*a* in accordance with one embodiment of the present invention having been described with reference to FIGS. 1 and 2.

Figure 7:
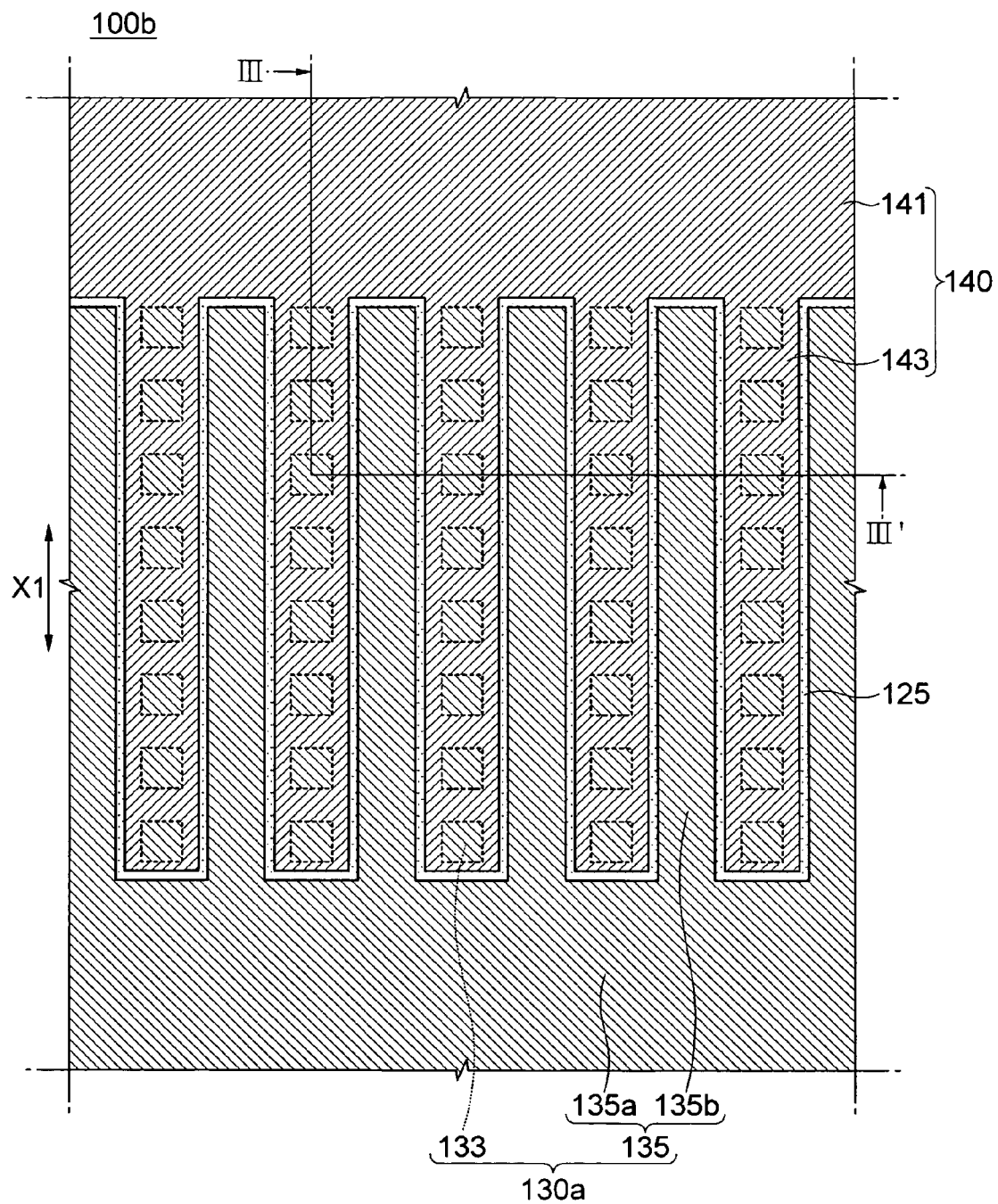
FIG. 7 is a plane-view showing other modified example of the semiconductor device in accordance with one embodiment of the present invention.
Figure 8:
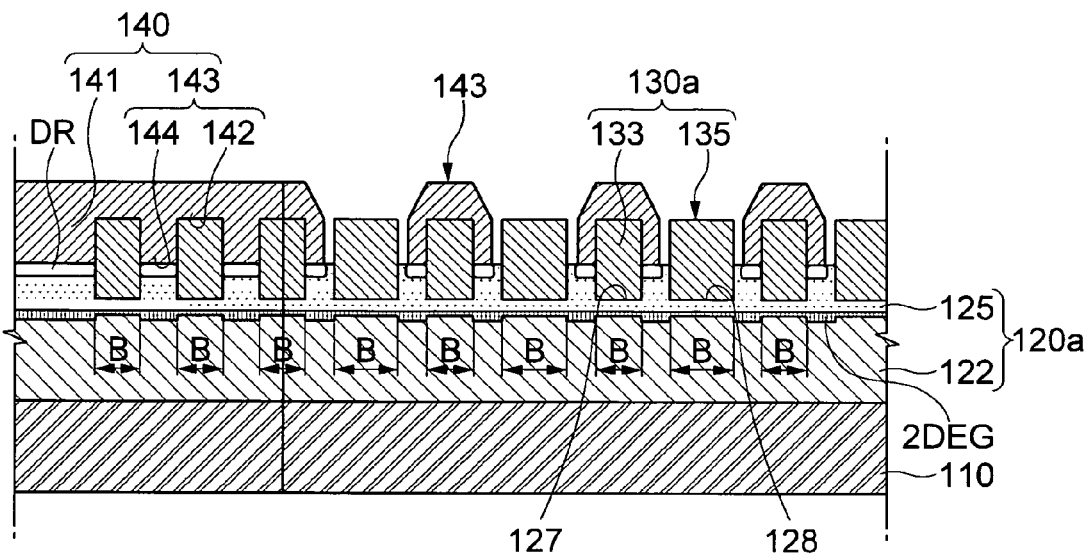
FIG. 8 is a cross-sectional view taken along a line III-III' of FIG. 7.
Figure 9:
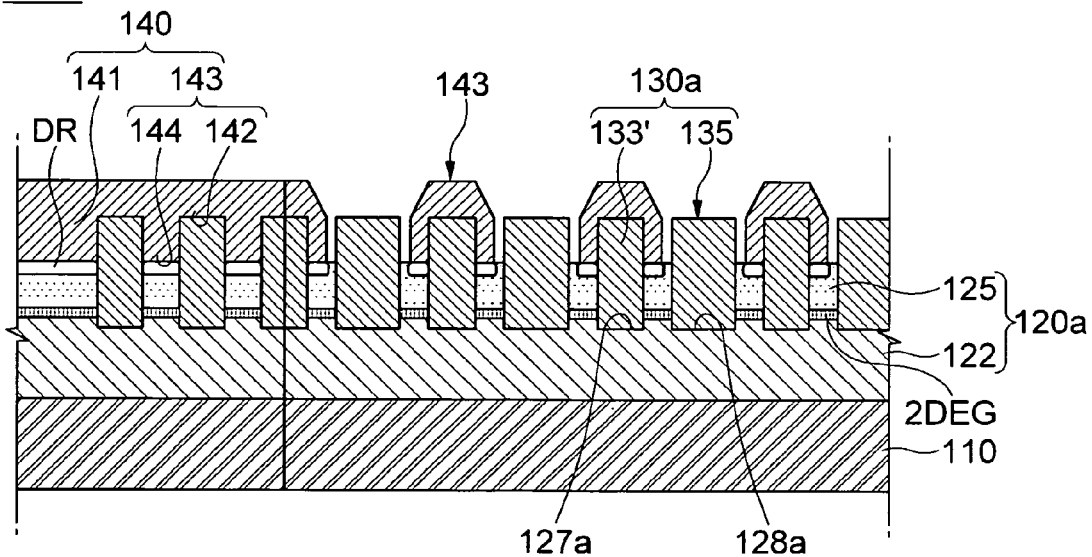
FIG. 9 is view showing a modified example of the semiconductor device shown in FIG. 8.

FIG. 7 is a plane-view showing other modified example of the semiconductor device in accordance with one embodiment of the present invention. FIG. 8 is a cross-sectional view taken along a line III-III' of FIG. 7. FIG. 9 is view showing a modified example of the semiconductor device shown in FIG. 8.

Referring to FIGS. 7 and 8, a semiconductor device 100*b* in accordance with other modified example of the present invention may include a base substrate 110, a semiconductor layer 120*a*, an ohmic electrode part 130*a*, and a Schottky electrode part 140. The semiconductor layer 120*a* may include a first nitride film 122 and a second nitride film 125 which are sequentially stacked on the base substrate 110. A 2-Dimensional Electron Gas (2DEG) may be generated on the boundary of the first nitride film 122 and the second nitride film 125. The ohmic electrode part 130*a* may include the first ohmic electrodes 133 and the second ohmic electrode 135, and the second ohmic electrode 135 may include the ohmic electrode plate 135*a* and the ohmic electrode lines 135*b*. On the second nitride film 125, the first ohmic electrodes 133 may be formed with a plurality of ohmic contact pillars with an island-shaped cross section. The ohmic electrode plate 134*a* may mostly have a rectangular-plate shape, and the ohmic electrode lines 134*b* may have a line shape extended from one surface of the ohmic electrode plate 134*a* to the first direction X1. In addition, the ohmic electrode lines 134*b* may be disposed to be spaced in parallel at a predetermined space. The Schottky electrode part 140 may include a Schottky electrode plate 141 and the Schottky electrode lines 143. The Schottky electrode lines 143 may have a shape extended toward the ohmic electrode plate 135*a* from one surface of the Schottky electrode plate 141 facing the ohmic electrode plate 135*a*. Also, the Schottky electrode lines 143 may be provided to cover the first ohmic electrodes 132. Thus, Schottky electrode part 140 may have first bonding portions 142 bonded to a top surface of the first ohmic electrodes 132, and second bonding portions 144 bonded to a top surface of the semiconductor layer 120*a*. A depletion region DR may be formed within the semiconductor layer 120*a* adjacent to the second bonding portions 144.

Meanwhile, the Schottky electrode part 130*a* may be extended to inside of the semiconductor layer 120*a*. For example, the first ohmic electrodes 133 and the second ohmic electrode 135 may be extended to inside of the second nitride film 125, and may be disposed to be spaced apart from the first nitride film 122. To this end, the first and second recesses 127 and 128 may be provided in the semiconductor layer 120*a*. The first recesses 127 may be trenches in which the first ohmic electrodes 133 are buried, and the second recesses 128 may be trenches in which the second ohmic electrodes 135 are buried. Although the present embodiment has been illustrated taking an example where the first recesses 127 have the same depth as that of the second recesses 128, depths of the first and second recesses 127 and 128 may be selectively different from one another. As for other example, the semiconductor device 100*b*' may be provided with the first ohmic electrodes 133 and the second ohmic electrodes 135 which are extended to inside of the first nitride film 122 through the first ohmic electrodes 133 and the second ohmic electrodes 135. To this end, on the semiconductor layer 120*b*, the first and second recesses 127*a* and 128*b* passing through the first nitride film 122 may be formed.

Herein, a concentration of the 2DEG of a region adjacent to the ohmic electrode part 130*a* may be controlled by controlling depths of the ohmic electrode part 130*a* extended to inside of the second nitride film 125. For example, the deeper the depths of the ohmic electrode part 130*a* (that is, as bottom surfaces of the ohmic electrode part 130*a* become adjacent to the first nitride film 122), the relatively thinner the thickness of the second nitride film 125 adjacent to the first nitride film 122. Thus, the concentration of the 2DEG within a region B of the semiconductor layer 120*a* adjacent to the ohmic electrode part 130*a* may be reduced. On the contrary, the thinner the depths of the ohmic electrode part 130*a* (that is, as the bottom surfaces of the ohmic electrode part 130*a* become far from the first nitride film 122), the relatively thicker the thickness of the second nitride film 125. In this case, the concentration of the 2DEG of the region B of the semiconductor layer 120*a* adjacent to the ohmic electrode part 130*a* may be increased.

The semiconductor devices 100*b* and 100*b*' in accordance with other modified embodiments of the present invention may be provided with the ohmic electrode part 130*a* extending to inside of the second nitride film 125. Thus, in the semiconductor devices 100*b* and 100*b*', by controlling depths at which the ohmic electrode part 130*a* is formed within the semiconductor layer 120*a*, it is possible to control the concentration of the 2DEG generated within the semiconductor layer 120*a* for each region. In this case, it is possible to control the on-voltage of the semiconductor device 100 by controlling the depth of the ohmic electrode part 130*a* extended to inside of the semiconductor layer 120*a*.

Figure 10:
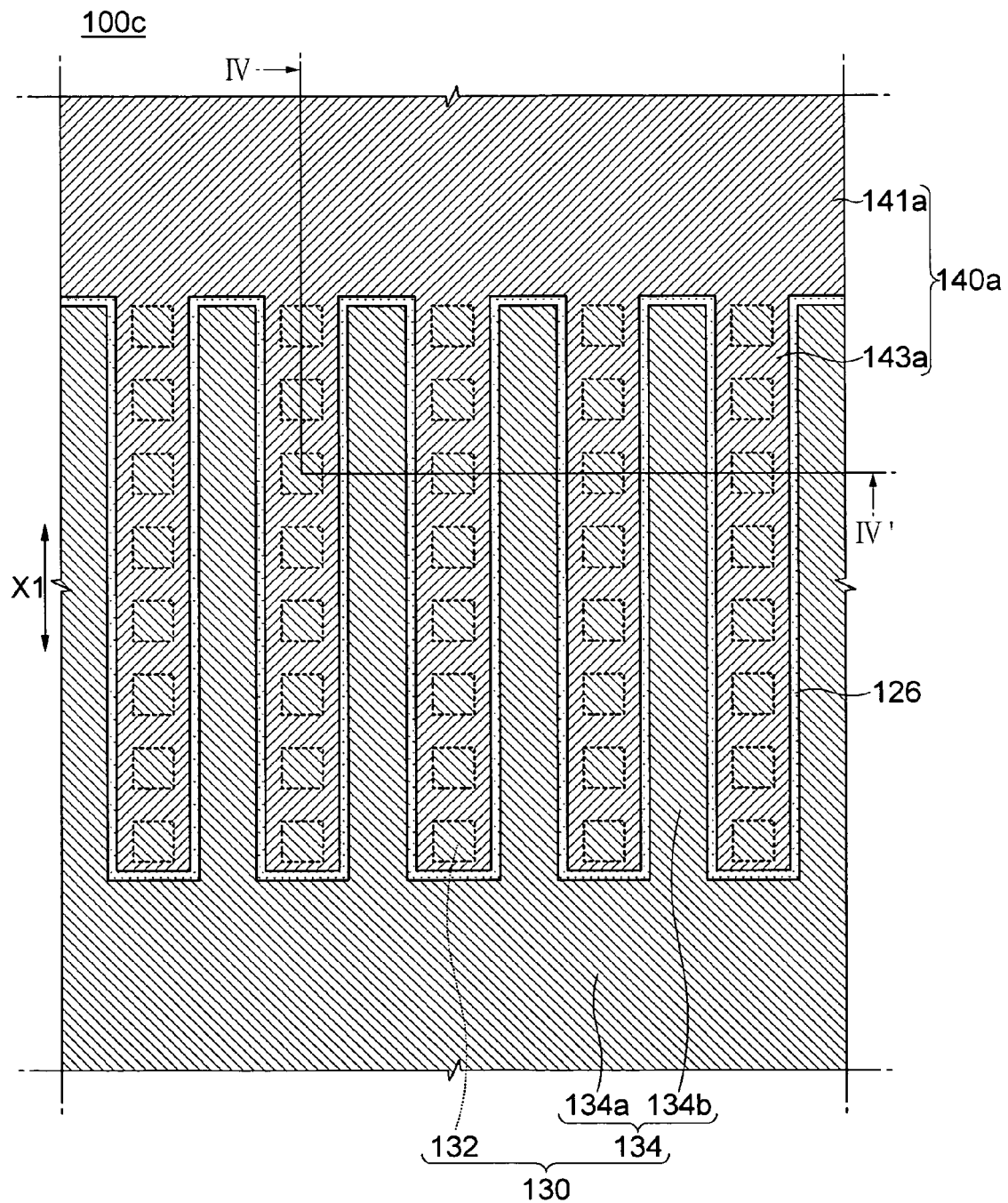
FIG. 10 is a plane-view showing other modified example of the semiconductor device in accordance with one embodiment of the present invention.
Figure 11:
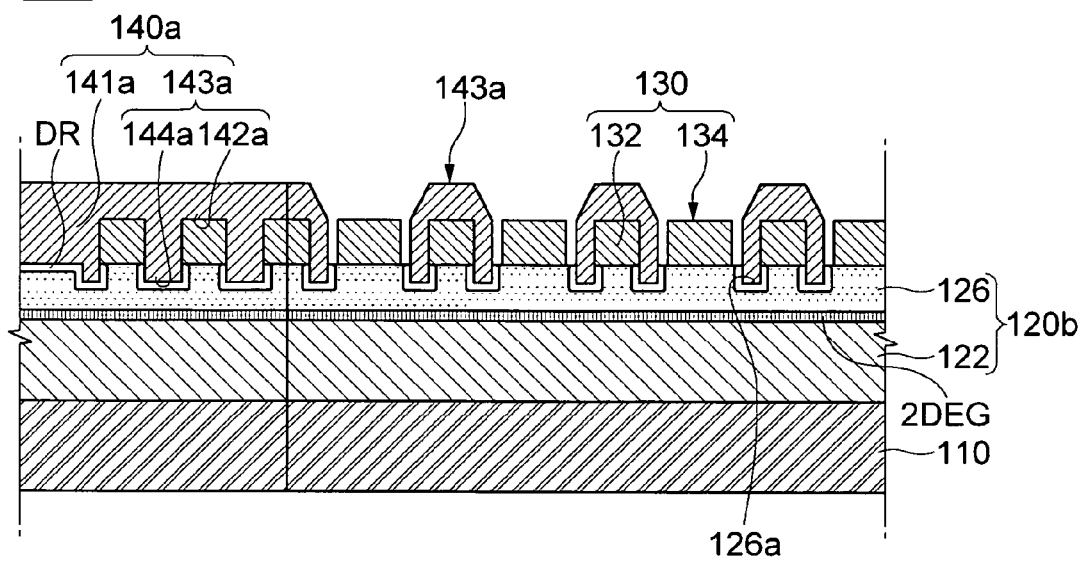
FIG. 11 is a cross-sectional view taken along a line IV-IV' of FIG. 10.
Figure 12:
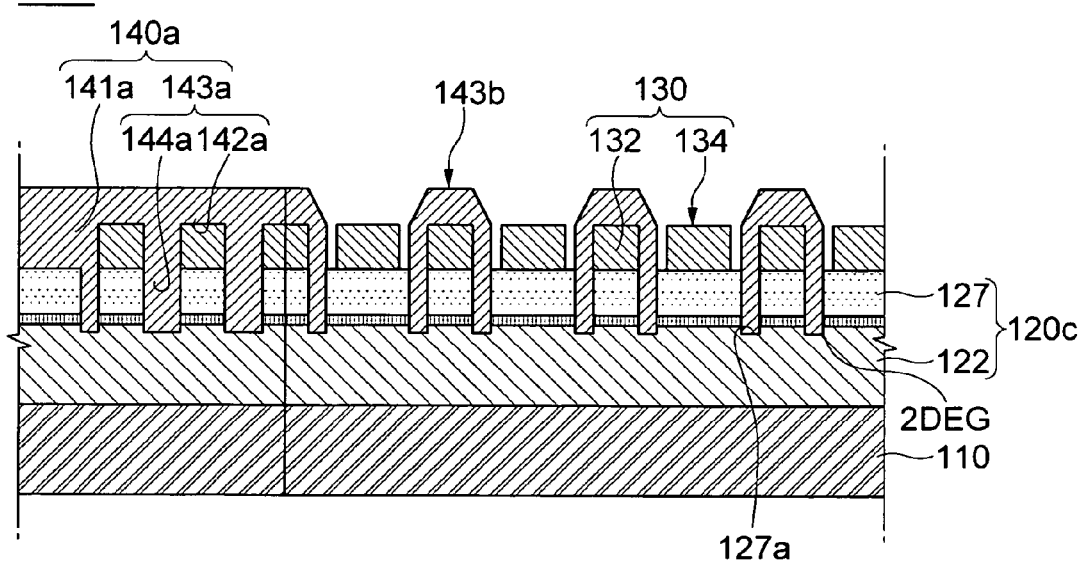
FIG. 12 is a view showing a modified example of the semiconductor device shown in FIG. 11.

FIG. 10 is a plane-view showing other modified example of the semiconductor device in accordance with one embodiment of the present invention. FIG. 11 is a cross-sectional view taken along a line IV-IV' of FIG. 10. FIG. 12 is a view showing a modified example of the semiconductor device shown in FIG. 11.

Referring to FIGS. 10 to 12, a semiconductor device 100c in accordance with other modified example of the present invention may include a base substrate 110, a semiconductor layer 120b, an ohmic electrode part 130, and a Schottky electrode part 140a. The semiconductor layer 120b may include a first nitride film 122 and a second nitride film 126 which are sequentially stacked on the base substrate 110. A 2-Dimensional Electron Gas (2DEG) may be generated on the boundary of the first nitride film 122 and the second nitride film 126. The ohmic electrode part 130 may include the first ohmic electrodes 133 and the second ohmic electrodes 134, and the second ohmic electrodes 134 may include the ohmic electrode plate 134a, and the ohmic electrode lines 134b. On the second nitride film 126, the first ohmic electrodes 133 may be formed with a plurality of ohmic contact pillars with an island-shaped cross section. The ohmic electrode plate 134a may mostly have a rectangular-plate shape, and the ohmic electrode lines 134b may have a line shape extended from one surface of the ohmic electrode plate 134a to the first direction X1. In addition, the ohmic electrode lines 134b may be disposed to be spaced in parallel to one another at a predetermined space. In addition, the ohmic electrode lines 134b may be disposed to be spaced in parallel to one another at a predetermined space. The Schottky electrode part 140a may include a Schottky electrode plate 141a and the Schottky electrode lines 143a. The Schottky electrode lines 143a may have a shape extended toward the ohmic electrode plate 134a from one surface of the Schottky electrode plate 141a facing the ohmic electrode plate 134a. Also, the Schottky electrode lines 143a may be provided to cover the first ohmic electrodes 132. Thus, Schottky electrode part 140a may have first bonding portions 142 bonded to a top surface of the first ohmic electrodes 132, and second bonding portions 144a bonded to a top surface of the first semiconductor layer 120. A depletion region DR may be formed within the first semiconductor layer 120 adjacent to the second bonding portions 144a.

Meanwhile, the second bonding portions 144a of the Schottky electrode part 140a may be extended to inside of the second nitride film 126. For example, the second bonding portions 144a may be extended downward from the top part of the second nitride film 126, and may be disposed to be spaced apart from the first nitride film 122. To this end, first recesses 126a may be provided on an exposed part of the second nitride film 126 between the first ohmic electrodes 132 and the second ohmic electrodes 134. The first recesses 126a may be formed on the second nitride film 126 adjacent to the first ohmic electrodes 132. As for other example, as shown in FIG. 12, the semiconductor device 100c' may be provided with the second bonding portions 144a which may be extended in such a manner to be bonded to the first nitride film 122 through the second nitride film 127. To this end, the second recesses 127a may be provided on the second nitride film 127 exposed to a region between the first ohmic electrodes 132 and the second ohmic electrodes 134.

Herein, a concentration of the 2DEG adjacent to the second bonding portions 144a may be controlled by controlling depths of the second bonding portions 144a extended to inside of the second nitride film 126. For example, the deeper the depths of the second bonding portions 144a (that is, as bottom surfaces of the second bonding portions 144a become adjacent to the first nitride film 122), the relatively thinner the thickness of the second nitride films 126 and 127 adjacent to the first nitride film 122. Thus, the concentration of the 2DEG within a region C of the semiconductor layer 120a adjacent to the second bonding portions 144a may be reduced. On the contrary, the thinner the depths of the second bonding portions 144a (that is, as the bottom surfaces of the second bonding portions 144a become far from the first nitride film 122), the relatively thicker the thickness of the second nitride films 126 and 127. In this case, the concentration of the 2DEG of the region C within the semiconductor layer 120a adjacent to the second bonding portions 144a may be increased.

The semiconductor devices 100c and 100c' in accordance with other modified embodiments of the present invention may be provided with the Schottky electrode part 140a having the second bonding portions 144a extending to inside of the second nitride films 126 and 127. In this case, it is possible to control the on-voltage of the semiconductor device 100 by controlling the depths of the second bonding portions 144a extended to inside of the semiconductor layer 120a. For example, when the second bonding portions 144a of the Schottky electrode part 140a are allowed to be deep above a predetermined level, it is possible to reduce the 2DEG of C region of the semiconductor layer 120 adjacent to the second bonding portions 144a. Further, when the second bonding portions 144a are allowed to be much deeper, the 2DEG of C region of the semiconductor layer 120a adjacent to the edge portions 144a may be removed. The semiconductor devices 100c and 100c' can reduce a reverse leakage current.

Figure 13:
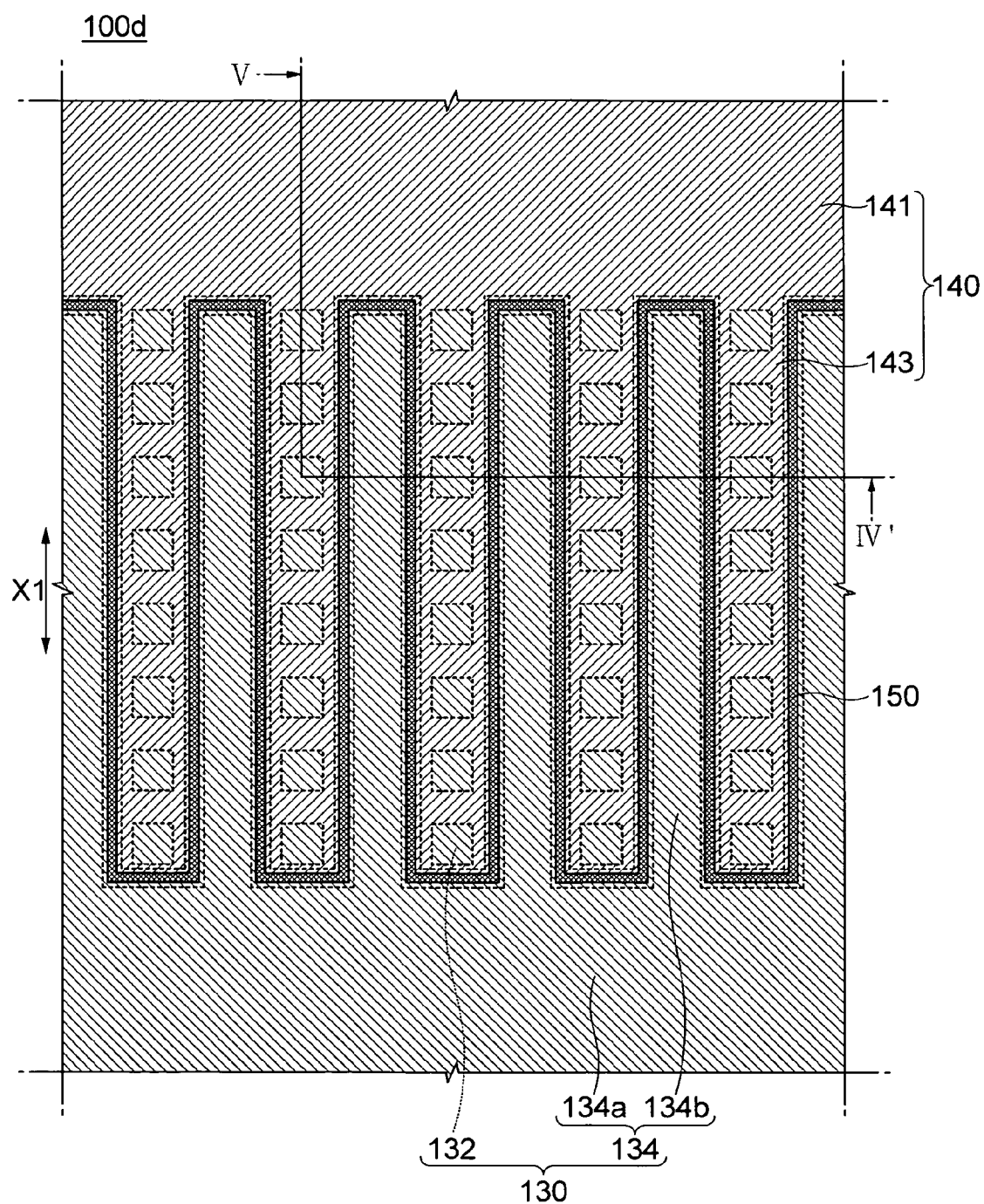
FIG. 13 is a plane-view showing other modified example of the semiconductor device in accordance with one embodiment of the present invention.
Figure 14:
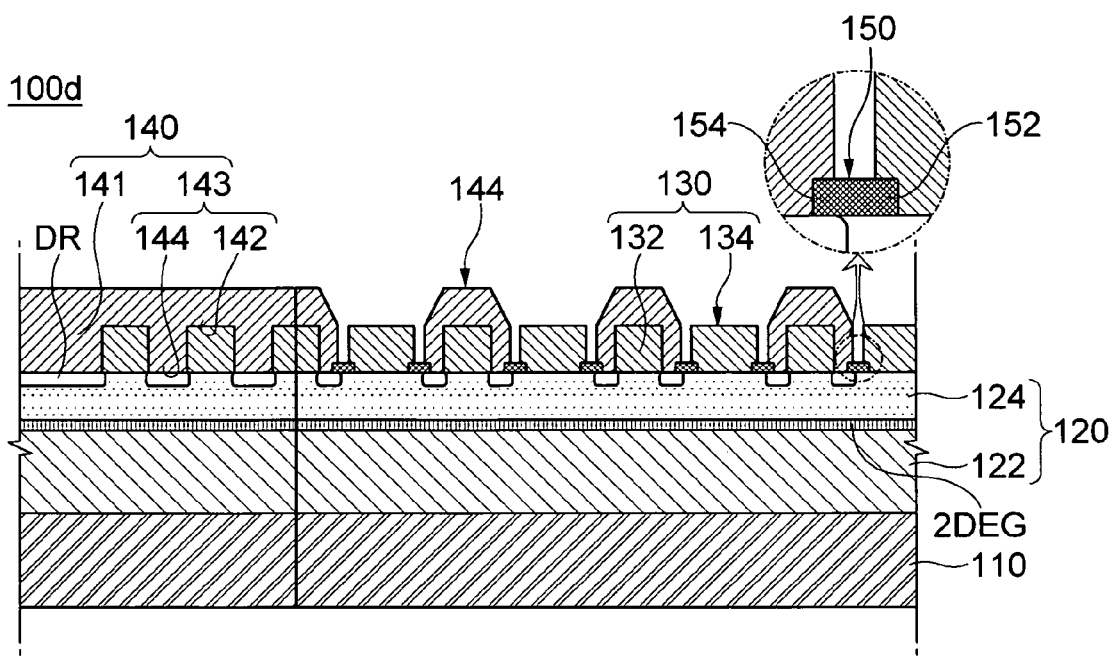
FIG. 14 is a cross-sectional view taken along a line V-V' of FIG. 13.

FIG. 13 is a plane-view showing other modified example of the semiconductor device in accordance with one embodiment of the present invention. FIG. 14 is a cross-sectional view taken along a line V-V' of FIG. 13.

Referring to FIGS. 13 to 14, a semiconductor device 100d in accordance with other modified example of the present invention may include a semiconductor layer 120 disposed on the base substrate 110, an ohmic electrode part 130 disposed on the semiconductor layer 120, a Schottky electrode part 140, and field plates 150. The semiconductor layer 120 may include a first nitride film 122 and a second nitride film 124 which are sequentially stacked on the base substrate 110. A 2-Dimensional Electron Gas (2DEG) may be generated on the boundary of the first nitride film 122 and the second nitride film 124. The ohmic electrode part 130 may include first ohmic electrodes 132 and second ohmic electrodes 134, and the second ohmic electrodes 134 may include the ohmic electrode plate 134a, and the ohmic electrode lines 134b which are extended vertically along the first direction X1 from one surface of the ohmic electrode plate 134a. Also, the Schottky electrode part 140 may include a Schottky electrode plate 141 disposed to be spaced apart from the ohmic electrode plate 134a, and Schottky electrode lines 143 extended vertically along the first direction X1 toward a space between the ohmic electrode lines 134b from the Schottky electrode plate 141. Thus, an interdigited configuration may be made where the ohmic electrode lines 134b and the Schottky electrode lines 143 are interdigited with one another.

The field plates 150 may be disposed on the semiconductor layer 120 between the ohmic electrode part 130 and the Schottky electrode part 140. In this case, the one side portions 152 of the field plates 150 may be provided to be covered by the ohmic electrode part 130, and the other side portions 154 of the field plates 150 may be provided to be covered by the Schottky electrode part 140. It is possible to distribute an electric field concentrated on the corner portions of the ohmic electrode part 130 and the Schottky electrode part 140.

Hereinafter, a detailed description will be given of a semiconductor device in accordance with another embodiment of the present invention.

Figure 15:
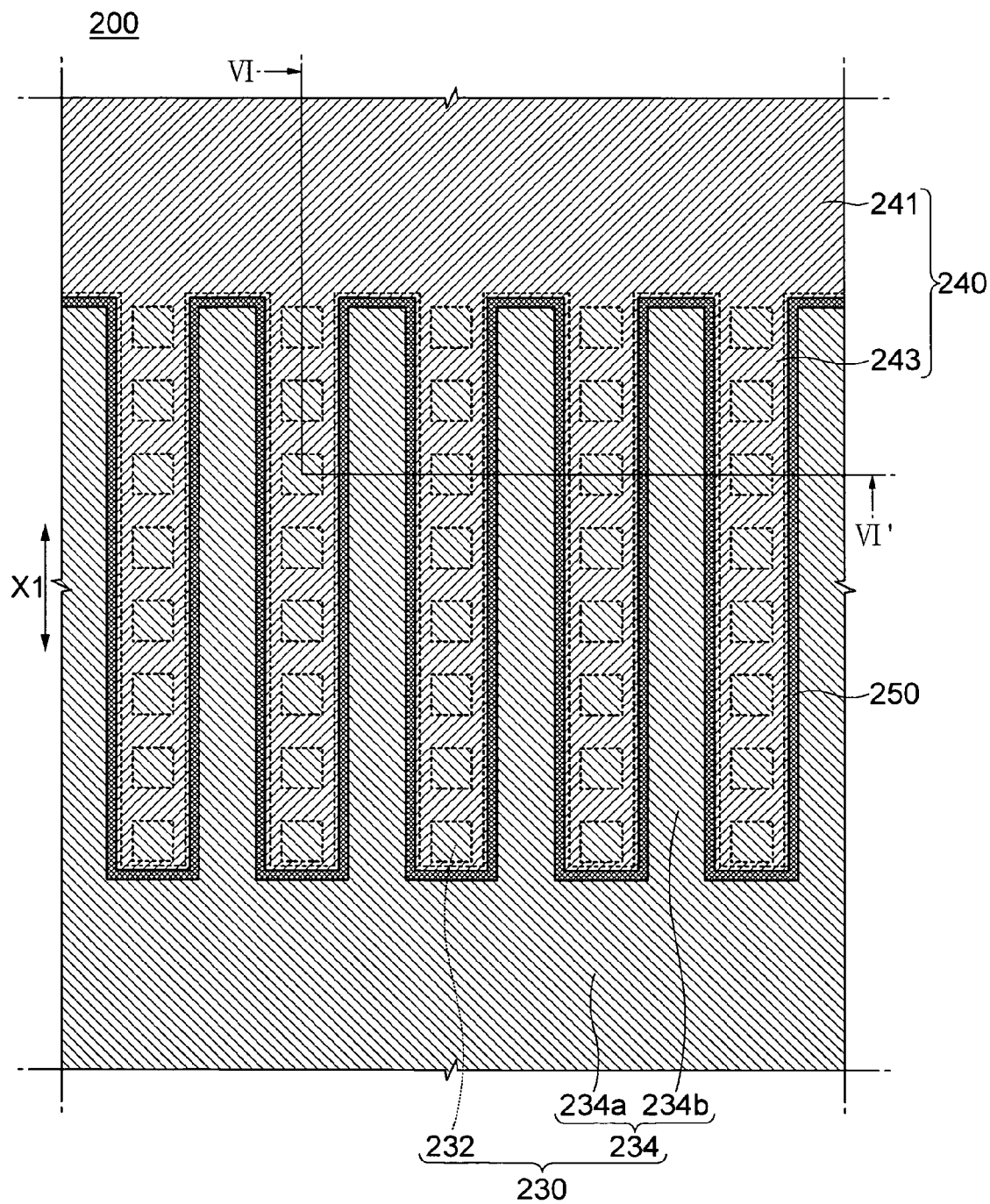
FIG. 15 is a plane-view showing a semiconductor device in accordance with another embodiment of the present invention.
Figure 16:
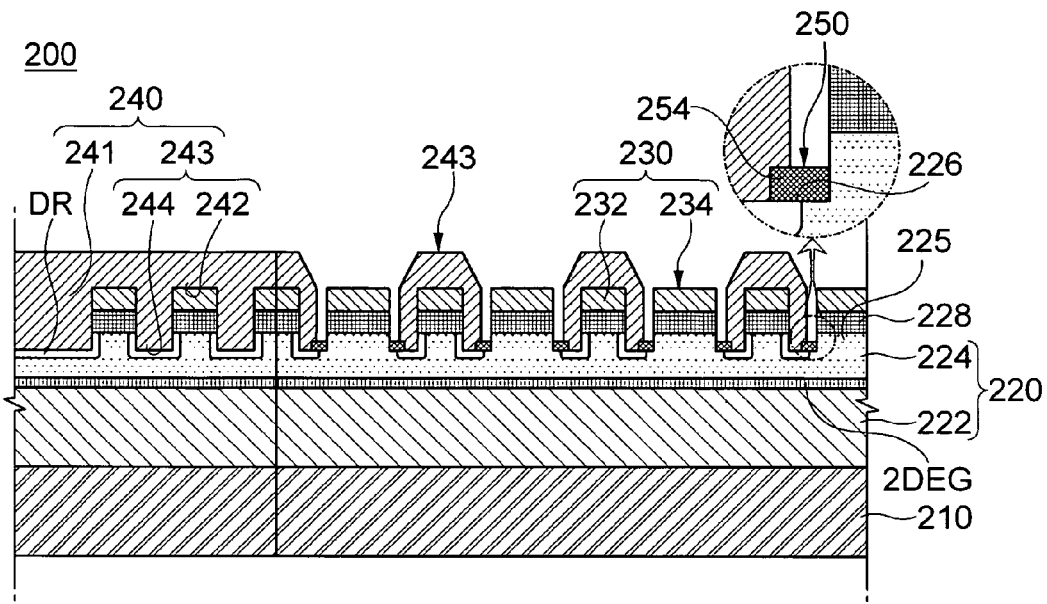
FIG. 16 is a cross-sectional view taken along a VI-VI' of FIG. 15.

FIG. 15 is a plane-view showing a semiconductor device in accordance with another embodiment of the present invention, and FIG. 16 is a cross-sectional view taken along a VI-VI' of FIG. 15.

Referring to FIGS. 15 and 16, the semiconductor device 200 may include a base substrate 210, a first semiconductor layer 220, an ohmic electrode part 230, and a Schottky electrode part 240.

The base substrate 210 may be a plate used for formation of the semiconductor device having a Schottky diode structure. For example, the base substrate 210 may be a semiconductor substrate. As for the base substrate 210, at least one of a silicon substrate, a silicon carbide substrate, and a sapphire substrate may be exemplified.

The first semiconductor layer 220 may be disposed on the base substrate 210, and may provide a current flow path to inside thereof. For example, the first semiconductor layer 220 may include a lower layer 222 and an upper layer 224. The lower layer 222 may be a semiconductor layer having a higher impurity concentration than that of the upper layer 224. For example, the lower layer 222 may be an N-type semiconductor film having a relatively high impurity concentration, and the upper layer 224 may be an N-type semiconductor film having a relatively low impurity concentration. Meanwhile, although the present embodiment has been illustrated taking an example where the first semiconductor layer 220 includes the lower layer 222 and the upper layer 224, the first semiconductor layer 220 may be formed only with the upper layer 224 without including the lower layer 222. Further, a buffering film (not shown) may be further provided between the base substrate 210 and the lower layer 222 so as to solve problems caused by lattice mismatch generated between the base substrate 210 and the lower layer 222.

The ohmic electrode part 230 may be disposed on the upper layer 224. For example, the ohmic electrode portion 230 may include second ohmic electrodes 234 and first ohmic electrodes 232 disposed on the upper layer 224. The second ohmic electrodes 234 may include an ohmic electrode plate 234a and the ohmic electrode lines 234b. The first ohmic electrodes 232 may include at least one of ohmic contact pillars with an island-shaped cross section. For example, the first ohmic electrodes 232 are composed of a plurality of ohmic contact pillars, and the ohmic contact pillars may be disposed to be spaced along a longitudinal direction of the ohmic electrode lines 234b, i.e., a first direction X1 at a predetermined space. The ohmic electrode plate 234a may mostly have a rectangular-plate shape. The ohmic electrode lines 234b may have a line shape extended toward the first direction X1 from one side of the ohmic electrode plate 234a. In addition, the ohmic electrode lines 234b may be disposed to be spaced in parallel to one another at a predetermined space.

Meanwhile, the second semiconductor layer 228 may be interposed between the first semiconductor layer 220 and the first ohmic electrodes 232. The second semiconductor layer 228 may be a semiconductor film having a relatively higher impurity concentration than that of the first semiconductor layer 220. For example, the second semiconductor layer 228 may be an N-type semiconductor film having a relatively higher impurity concentration than that of the first semiconductor layer 220. The first ohmic electrodes 232 may be provided to be bonded to the second semiconductor layer 228 to thereby come into ohmic contact with the second semiconductor layer 228.

The Schottky electrode part 240 may be disposed on the first semiconductor layer 220 to be opposite to the ohmic electrode part 230. The Schottky electrode part 240 may include a Schottky electrode plate 241 and Schottky electrode lines 243. The Schottky electrode plate 241 may mostly have a rectangular-plate shape. The Schottky electrode plate 241 may be disposed on the upper layer 224 to be spaced apart from the second ohmic electrodes 234 with respect to the first ohmic electrodes 232 interposed therebetween. The Schottky electrode lines 243b may have a shape extended toward the ohmic electrode plate 234a from one surface of the Schottky electrode plate 241 facing the ohmic electrode plate 234a. In more particular, any one of the Schottky electrode lines 243 may be disposed to be interposed between two ohmic electrode lines 234b. In addition, the Schottky electrode lines 243 may be provided to cover the first ohmic electrodes 232. Thus, the Schottky electrode part 240 may have first bonding portions 242 and second bonding portions 244, wherein the first bonding portions 242 are bonded to a top surface of the first ohmic electrodes 232 and the second bonding portions 244 are bonded to a top surface of the semiconductor layer 220. A depletion region DR may be generated within the semiconductor layer 220 adjacent to the second bonding portions 244.

Also, the Schottky electrode part 240 may be extended to inside of the first semiconductor layer 220. For example, the second bonding portions 244 of the Schottky electrode part 240 may be extended to inside of the upper layer 224 of the first semiconductor layer 220, and may be disposed to be spaced apart from the lower layer 222. Thus, the Schottky electrode part 240 may have a bottom surface with a height lower than that of a top surface of the second semiconductor layer 228. To this end, the recesses 226 may be provided in the upper layer 224 of the first semiconductor layer 220. The recesses 226 may be formed by etching remaining regions excluding regions where the first ohmic electrodes 232 are formed on the upper layer 224. Thus, the upper layer 224 may have protrusions 125 having an upward protruded structure formed on the upper layer 224, and the first ohmic electrodes 232 and the second semiconductor layer 228 may be sequentially stacked on the protrusions 225.

Meanwhile, the ohmic electrode part 230 and the Schottky electrode part 240 may be formed of various materials. For example, the first and second ohmic electrodes 232 and 234 may be formed of the same metallic material as one another, and the Schottky electrode part 240 may be formed of metallic material different from those of the first and second ohmic electrodes 232 and 234. In this case, the first and second ohmic electrodes 232 and 234 may be formed of a material composed of at least one metal element of Al, Mo, Au, Ni, Pt, Ti, Pd, Ir, Rh, Co, W, Ta, Cu, and Zn. On the contrary, the Schottky electrode part 240 may be formed of a material composed of one or more metal elements different from those of the ohmic electrode part 230.

The semiconductor device 200 may further include field plates 250. The field plates 250 may be disposed on the first semiconductor layer 220 between the ohmic electrode part 230 and the Schottky electrode part 240. In this case, a part of internal side portions 254 of the field plates 250 may be provided to be covered by the Schottky electrode part 240. The field plates 250 can provide an effect of distributing an electric field concentrated on corner portions of the Schottky electrode part 240.

As described above, the semiconductor device 200 may have an interdigitated configuration in which the ohmic electrode lines 234b are interdigitated with the Schottky electrode lines 243 on the semiconductor layer 210. In addition, the Schottky electrode part 240 covers the ohmic contact pillars of the first ohmic electrodes 232, thereby achieving a prominence and depression structure in which the Schottky electrode part 240 is engaged with the first ohmic electrodes 232 up and down.

Continuously, a detailed description will be given of various operation states of the semiconductor device in accordance with other embodiments of the present invention having been described with reference to FIGS. 15 and 16.

Figure 17A:
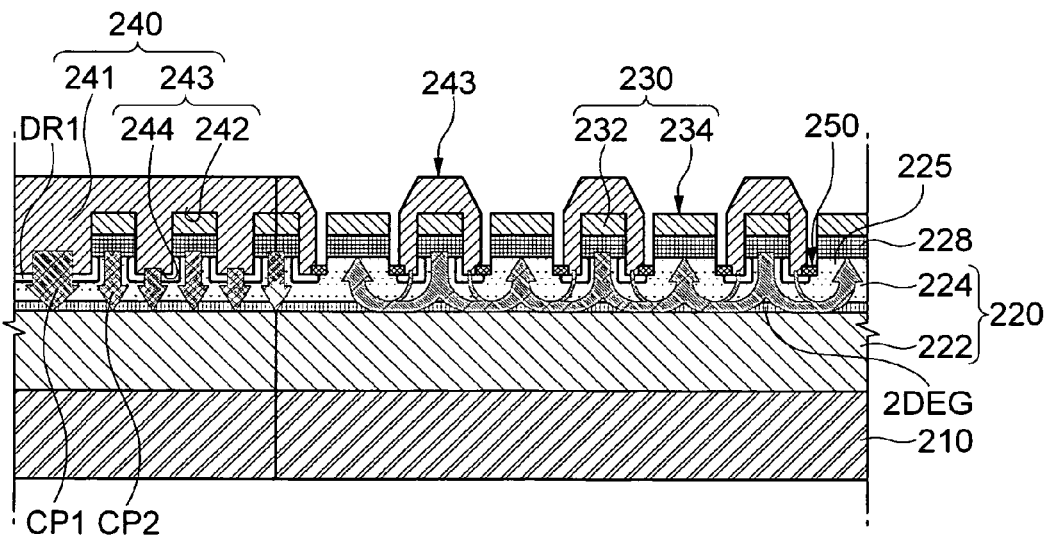
FIGS. 17A to 17C are views showing operation states of the semiconductor device shown in FIGS. 15 and 16, respectively.
Figure 17B:
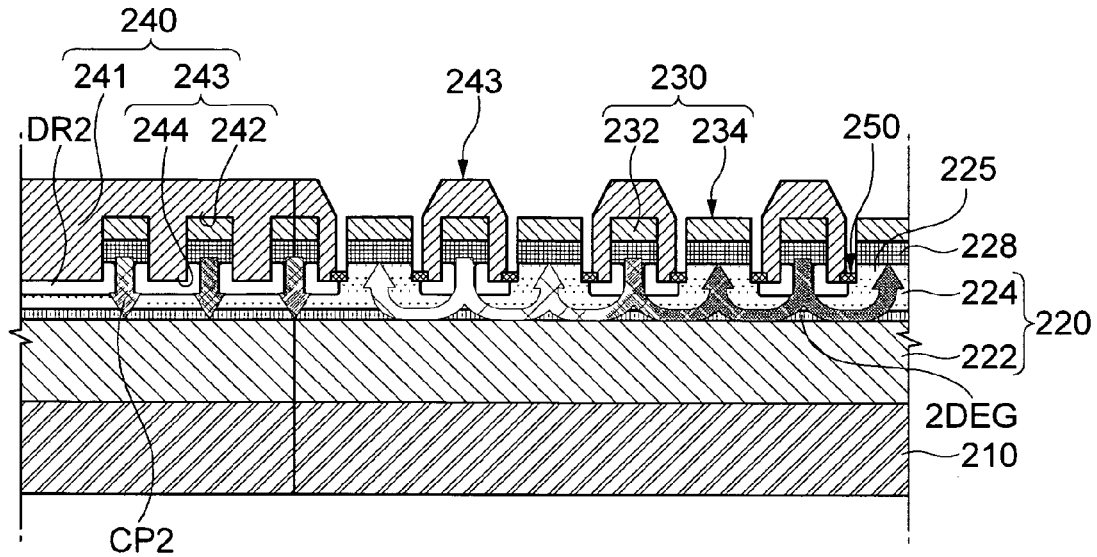
Figure 17C:
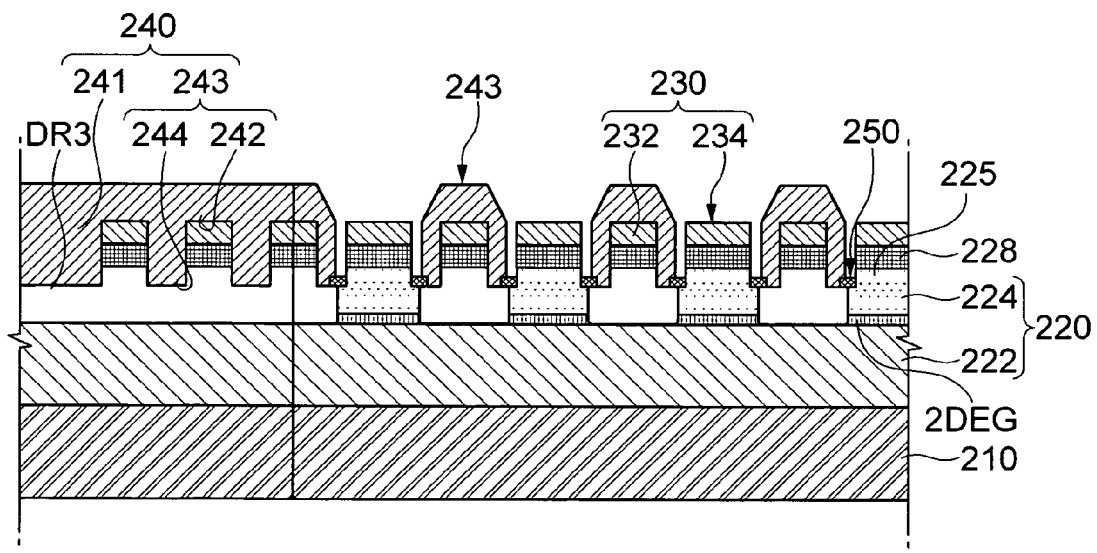

FIGS. 17A to 17C are views showing operation states of the semiconductor device shown in FIGS. 15 and 16, respectively. FIG. 17A is a view showing an operation state of the semiconductor device when driven at a forward voltage equal to or higher than an on-voltage of the Schottky diode. Referring to FIG. 17A, when the semiconductor device 200 in accordance with other embodiment of the present invention is driven at a first forward voltage equal to or higher than the on-voltage of the Schottky diode, a depletion region (DR1) generated where the first semiconductor layer 220 and the Schottky electrode part 240 are joined together may be relatively reduced. Thus, in the semiconductor device 200, a current may flow through a first current path CP1 and a second current path CP2, wherein the first current path CP1 passes through the first semiconductor layer 220 from the second bonding portions 244, and the second current path CP2 passes through the first and second semiconductor layers 220 and 228 from the first ohmic electrodes 232. In this case, since forward currents of the semiconductor device 200 are increased, it is possible to operate the semiconductor device 200 even at a low on-voltage.

FIG. 17B is a view showing an operation state of the semiconductor device when driven at a forward voltage lower than an on-voltage of the Schottky diode. Referring to FIG. 17B, when the semiconductor device 200 in accordance with other embodiment of the present invention is driven at a second forward voltage lower than the on-voltage of the Schottky diode, a depletion region DR2 generated where the first semiconductor layer 220 and the Schottky electrode part 240 are joined together may be more expanded than the case where the semiconductor device 200 is driven at the first forward voltage as described in FIG. 17A. Such the expanded depletion region DR2 may be wide enough to block a current flow between the first semiconductor layer 220 and the Schottky electrode part 240. However, the second forward voltage may be controlled such that the depletion region DR2 fails to block the second current path CP2. Thus, in the semiconductor device 200, a current may flow through the second current path CP2 alone.

FIG. 17C is a view showing an operation state of the semiconductor device when driven at a reverse voltage. Referring to FIG. 17C, when the semiconductor device 100 is driven at the reverse voltage, a depletion region DR3 may be more expanded to the 2DEG than the depletion region DR2 shown in FIG. 17B. Such the depletion region DR3 may be expanded to block all of first and second current paths CP1 and CP2 of FIG. 17A. The depletion region DR3 can block all current flows passing through the first and second current paths CP1 and the CP2.

As described above, when the semiconductor device 200 is driven in the forward direction, a current may flow to the second ohmic electrodes 234 by the first ohmic electrodes 232 positioned below the Schottky electrode part 240 even in a state where the driving voltage is lower than the on-voltage of the Schottky diode, simultaneously while the current may flow through the first ohmic electrodes 232 and the Schottky electrode part 240 in a state where the driving voltage is higher than the on-voltage of the Schottky diode. Thus, since the semiconductor device 200 may increase forward currents, it can be operated even at a low driving voltage. Also, when the semiconductor device 200 is driven in the reverse direction, the depletion region DR3 generated by the Schottky electrode part 240 allows the 2DEG to be disconnected, thereby stably blocking a current flow.

Hereinafter, a description will be given of a method for manufacturing the semiconductor device in accordance with other embodiment of the present invention. Herein, the repeated description for the semiconductor device having been described with reference to FIGS. 15 and 16 will be omitted or simplified.

FIGS. 18A to 18D are views showing methods for manufacturing the semiconductor device 100 in accordance with other embodiments of the present invention, respectively.

Figure 18A:
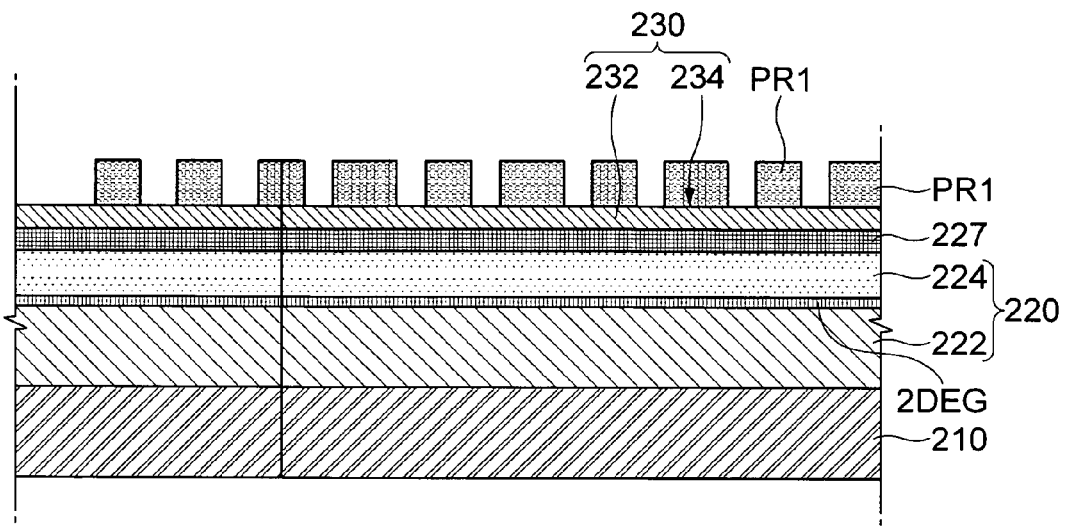
FIGS. 18A to 18D are views showing methods for manufacturing the semiconductor device 100 in accordance with other embodiments of the present invention, respectively.

Referring to FIG. 18A, the base substrate 210 may be prepared. A step of preparing the base substrate 210 may include a step of preparing a semiconductor substrate. The step of preparing the base substrate 210 may include a step of preparing at least one of a silicon substrate, a silicon carbide substrate, and a sapphire substrate.

The first semiconductor layer 220, the second semiconductor formation film 227, and a first metal film 233 may be sequentially stacked on the front surface of the base substrate 210. A step of forming the first semiconductor layer 220 may include a step of forming the lower layer 222 on the base substrate 210, and a step of forming the upper layer 224 on the lower layer 222. A step of forming the second semiconductor formation film 227 may include a step of forming the semiconductor film having a relatively higher impurity concentration than that of the upper layer 224, on the base substrate 210. For example, the step of forming the first semiconductor layer 220 may be achieved by epitaxial-growing the lower layer 222 by using the base substrate 210 as a seed layer, and then epitaxial-growing the upper layer 224 by using the lower layer 222 as a seed layer. Further, the step of forming the second semiconductor formation film 227 may achieved by performing an epitaxial-growth process in which the upper layer 224 is used as a seed layer. As for an epitaxial growth process for forming the first semiconductor layer 220 and the second semiconductor formation film 227, at least one of a molecular beam epitaxial growth process, an atomic layer epitaxial growth process, a flow modulation organometallic vapor phase epitaxial growth process, a flow modulation organometallic vapor phase epitaxial growth process, a flow modulation organometallic vapor phase epitaxial growth process, and a hybrid vapor phase epitaxial growth process may be used. Furthermore, as for another process for forming the first semiconductor layer 220 and the second semiconductor formation film 227, any one of a chemical vapor deposition process and a physical vapor deposition process may be used. The first photoresist pattern PR1 for selectively exposing a partial region of the first metal film 233 may be formed on the first metal film 233.

Figure 18B:
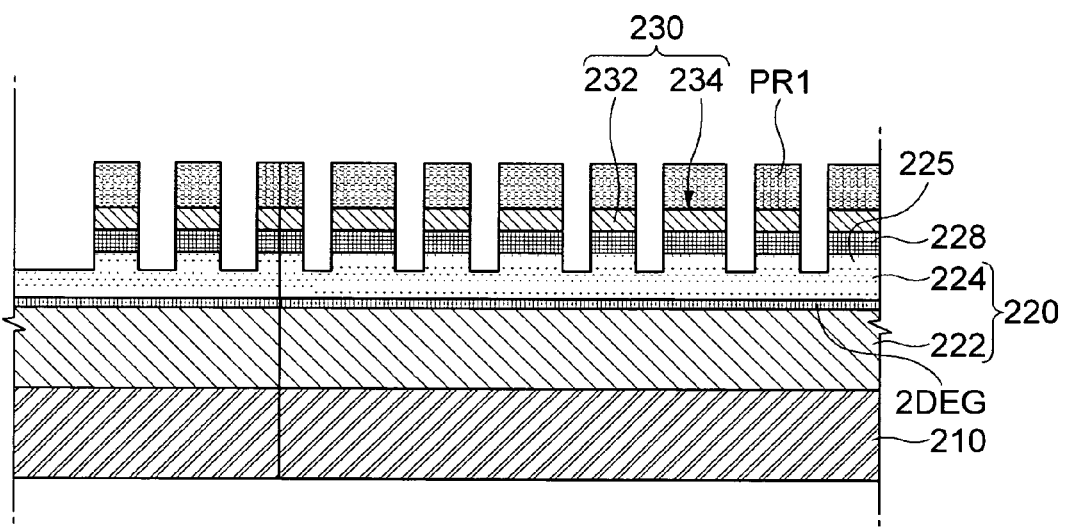

Referring to FIG. 18B, the first ohmic electrodes 232 and the second semiconductor layer 228 may be formed. In a step of forming the first ohmic electrodes 232 and the second semiconductor layer 228, recesses 226 for exposing the upper layer 224 of the first semiconductor layer 220 may be formed by using the first photoresist pattern PR1 as an etching mask. Thus, on the first semiconductor layer 220, the protrusions 225 extended upward from the upper layer 224 and the first ohmic electrodes 232 and the second semiconductor layer 228 sequentially stacked on the protrusions 225 may be formed. Herein, the protrusions 225, and the first ohmic electrodes 232 and the second semiconductor layer 228 may be formed to have a pillar shape on the first semiconductor layer 220.

Figure 18C:
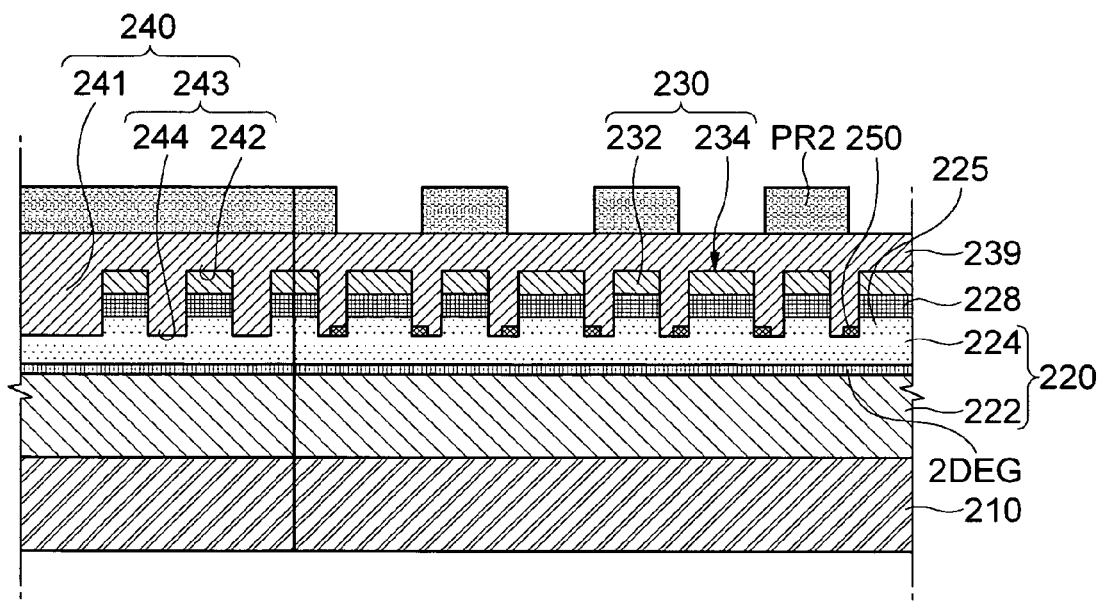

Referring to FIG. 18C, the field plates 250 may be formed. For example, the step of forming the field plates 250 may include a step of forming an insulating film covering a resulting material formed with the second semiconductor layer 228 and the first ohmic electrodes 232, and then removing insulating films of remaining regions, except for regions of the insulating film within the recesses 226. Thus, the field plates 250 may be formed on regions of the recesses 226. In this case, the field plates 250 may be disposed to be spaced apart from the protrusions 225 on which the first ohmic electrodes 232 are disposed. The field plates 250 may be disposed to be adjacent to the protrusions 225 on which the second ohmic electrodes 234 are disposed.

Thereafter, on the resulting material formed with the first ohmic electrodes 232, the second metal film 239 may be formed. In a step of forming the second metal film 239, the second metal film 239 may be formed of metallic material different from that of the first metal film, indicated by reference numeral 233 of FIG. 18A, for formation of the ohmic electrode part 230. On the first ohmic electrodes 232, the second photoresist pattern PR2 for selectively exposing a partial region of the second metal film 239 may be formed.

Figure 18D:
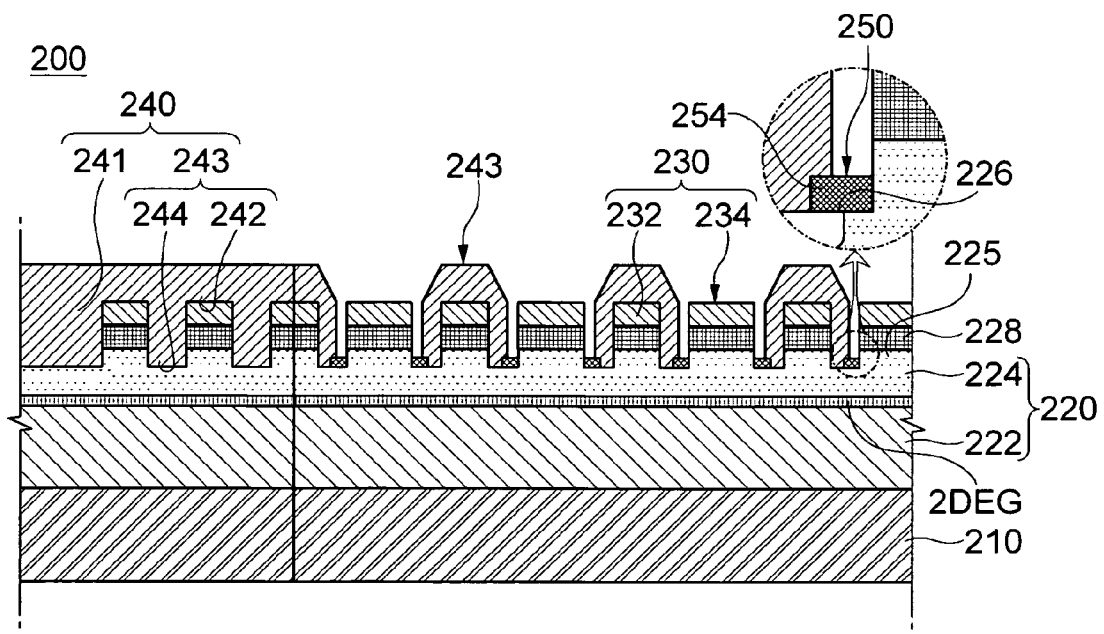

Referring to FIG. 18D, the Schottky electrode part 240 may be formed. For example, the second metal film, indicated by reference numeral 239 of FIG. 18C, may be etched by using the second photoresist pattern PR2 of FIG. 18C as an etching mask. Thus, on the semiconductor layer 220, the Schottky electrode part 240 having the Schottky electrode lines 243 may be formed that covers the first ohmic electrodes 232.

Hereinafter, a description will be given of various modified examples of the semiconductor device in accordance with other embodiment of the present invention. The repeated description for the same components between the above-described semiconductor device and semiconductor devices in accordance with various modified embodiments will be omitted or simplified. Since those skilled in the art can analogize operation processes of the modified examples to be described from the operation states of the semiconductor device having been described with reference to FIGS. 17A and 17C, the description for operation processes of the modified examples will be omitted. Also, since those skilled in the art can analogize manufacturing methods of the modified examples to be described from the manufacturing methods of the semiconductor device having been described with reference to FIGS. 18A and 18D, the description for manufacturing methods of the modified examples will be omitted.

Figure 19:
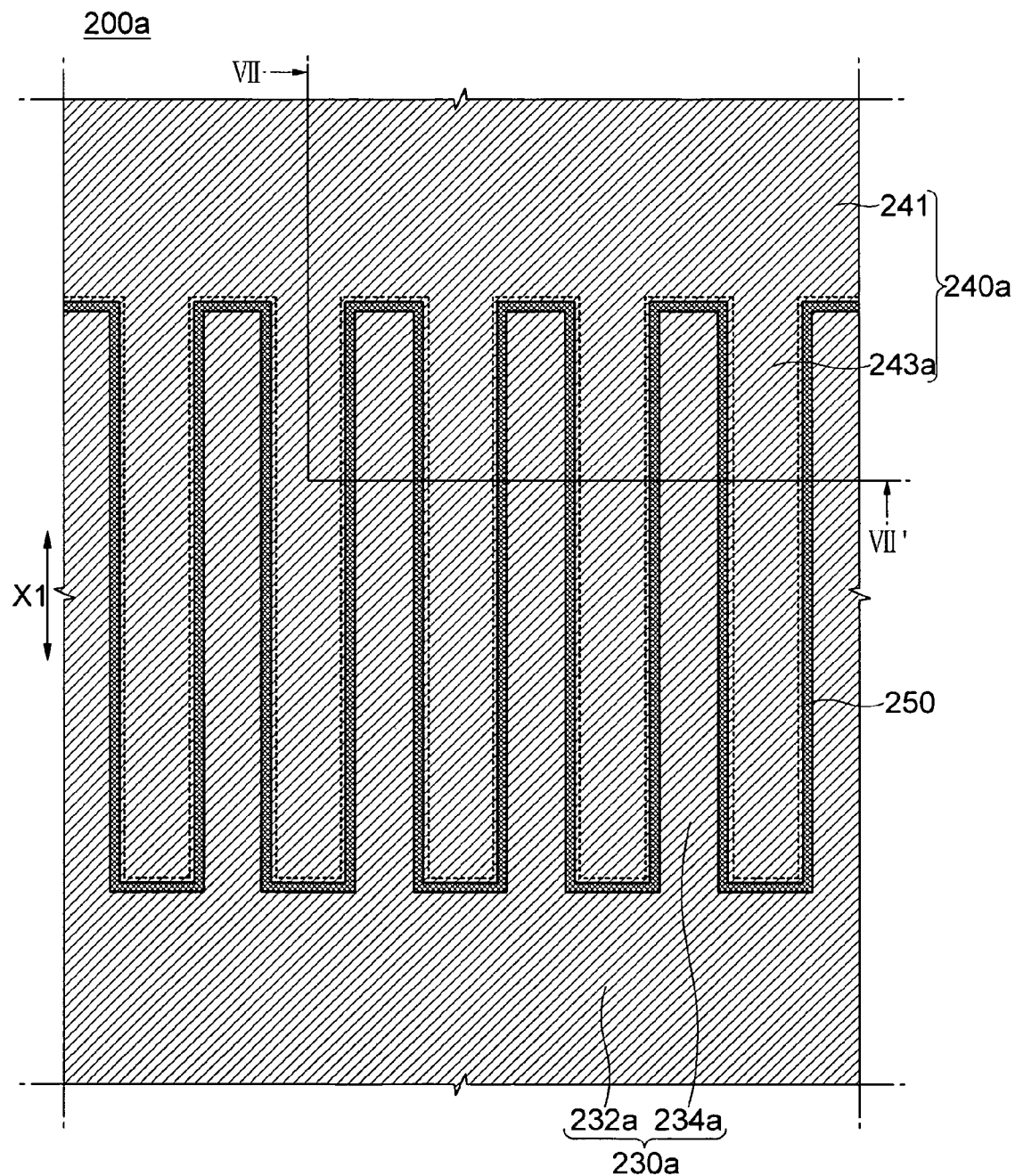
FIG. 19 is a plane-view showing one modified example of the semiconductor device in accordance with other embodiment of the present invention.
Figure 20:
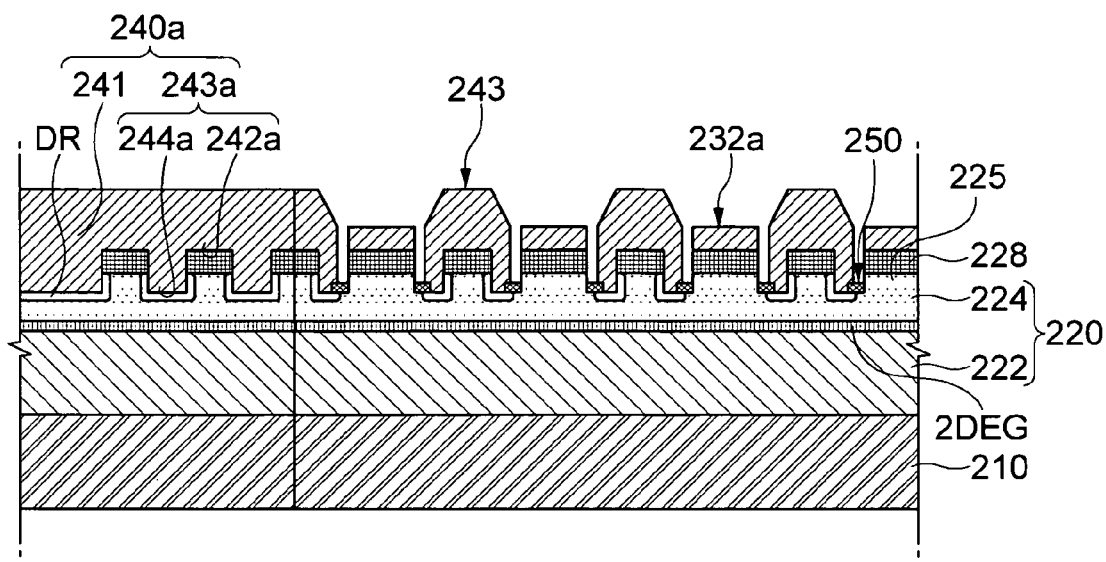
FIG. 20 is a cross-sectional view taken along a line VII-VII" shown in FIG. 19.

FIG. 19 is a plane-view showing one modified example of the semiconductor device in accordance with other embodiment of the present invention. FIG. 20 is a cross-sectional view taken along a line VII-VII" shown in FIG. 19.

Referring to FIGS. 19 and 20, the semiconductor device 200a may include a base substrate 210, a first semiconductor layer 220, an ohmic electrode part 230a, and a Schottky electrode part 240a. The first semiconductor layer 220 may include an upper layer 224 and a lower layer 222 sequentially stacked on the front surface of the base substrate 210, wherein the upper layer 224 has a lower impurity concentration than that of the lower layer 222. On the top surface of the upper layer 224, a plurality of protrusions 225 is formed. On the protrusions 225, the second semiconductor layer 228 having a higher impurity concentration than that of the upper layer 224 may be disposed. The ohmic electrode part 230a may include an ohmic electrode plate 232a and a plurality of ohmic electrode lines 234a with a line shape extended to the first direction X1 from one side of the ohmic electrode plate 234a. In addition, the ohmic electrode lines 234a may be disposed in parallel to one another at a predetermined space.

The Schottky electrode part 240a may be disposed on the semiconductor layer 220 to be opposite to the ohmic electrode part 230. The Schottky electrode part 140a may include a Schottky electrode plate 241 and Schottky electrode lines 243a. The Schottky electrode plate 241 may be disposed on the upper layer 224 to be spaced apart from the second ohmic electrodes 234 with respect to the first ohmic electrodes 232 interposed therebetween. The Schottky electrode lines 243a may have a line shape extended toward the ohmic electrode plate 234a from one surface of the Schottky electrode plate 241 facing the ohmic electrode plate 234.

In the semiconductor device 200a with the same structure, the Schottky electrode part 240a may have first bonding portions 242a bonded to the second semiconductor layer 228, and second bonding portions 244a bonded to the upper layer 224 of the first semiconductor layer 220. Herein, the first bonding portions 242a come into ohmic contact with the second semiconductor layer 228, and the second bonding portions 244a come into Schottky contact with the upper layer 224 of the first semiconductor layer 220. The semiconductor device 200a having the same structure may have a structure in which there is no separate ohmic electrode within the Schottky electrode part 240 (e.g., first ohmic electrodes 232 of FIG. 16). Thus, it is not necessary to perform a separate process for formation of ohmic electrodes within the Schottky electrode part 240.

Figure 21:
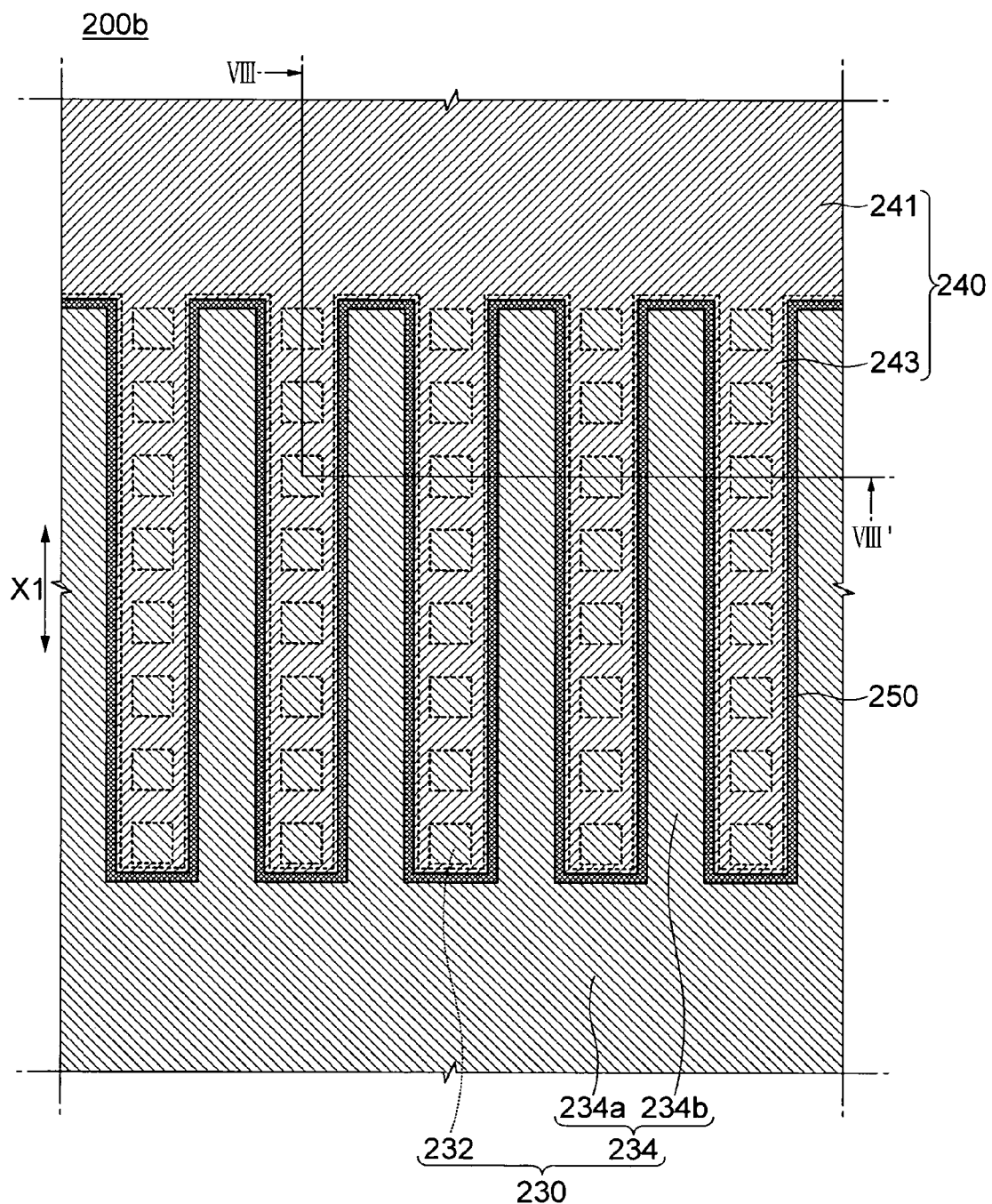
FIG. 21 is a plane-view showing another modified example of the semiconductor device in accordance with other embodiment of the present invention.
Figure 22:
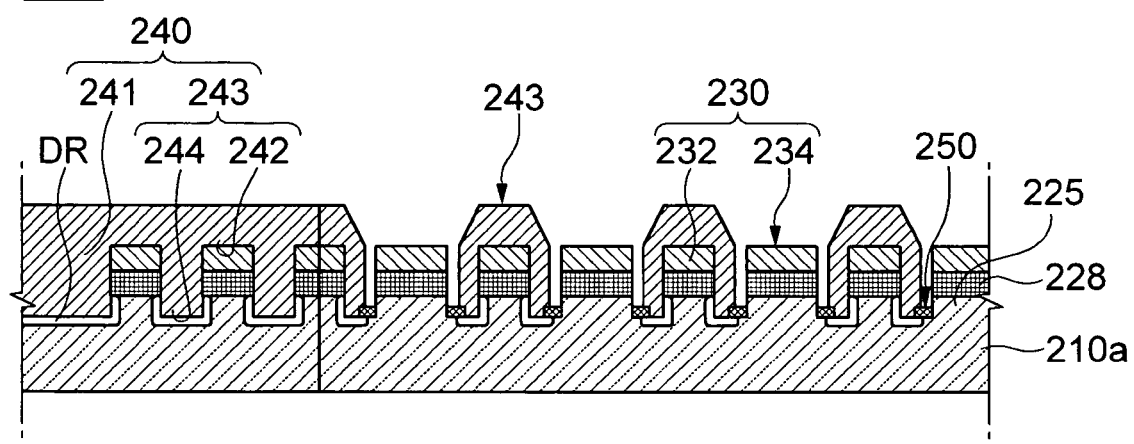
FIG. 22 is a cross-sectional view taken along a line VIII-VIII' shown in FIG. 21.

FIG. 21 is a plane-view showing another modified example of the semiconductor device in accordance with other embodiment of the present invention. FIG. 22 is a cross-sectional view taken along a line VIII-VIII' shown in FIG. 21.

Referring to FIGS. 21 and 22, the semiconductor device 200b may include a base substrate 210a, a second semiconductor layer 228, an ohmic electrode part 230, a Schottky electrode part 240, and field plates 250. The ohmic electrode part 230 may be interposed between the second semiconductor layer 228, on the base substrate 210a. The ohmic electrode part 230 may include first ohmic electrodes 232 having a plurality of ohmic contact pillars, and second ohmic electrodes 234 which have an ohmic electrode plate 234a and the ohmic electrode lines 234b. The ohmic electrode lines 234b and Schottky electrode lines 243 may be formed in an interdigited configuration on the semiconductor layer 210. In addition, the Schottky electrode part 240 covers the ohmic contact pillars of the first ohmic electrodes 232, thereby achieving a prominence and depression structure in which the Schottky electrode part 240 is engaged with the first ohmic electrodes 232 up and down.

Meanwhile, the base substrate 210a may be a semiconductor substrate. For example, the base substrate 210a may be a semiconductor substrate having a lower impurity concentration than that of the second semiconductor layer 228. In addition, the base substrate 210a may be formed of a material with high resistivity. For example, the base substrate 210a may be an N-type semiconductor film having a low impurity concentration, and the second semiconductor layer 228 may be an N-type semiconductor film having a higher impurity concentration than that of the base substrate 210a.

Comparing the semiconductor device 200b with the above-described semiconductor devices 200 and 200a, the semiconductor device 200b is provided with the base substrate 210a itself as a semiconductor film having a low impurity concentration, so that it is not necessary to form a separate semiconductor layer between the base substrate 210a and the second semiconductor layer 228. For example, in the method for manufacturing the semiconductor device 200a, a process (e.g., epitaxial-growth process, a chemical vapor deposition process, and a physical vapor deposition process) of forming the separate semiconductor layer (e.g., the first semiconductor layer 220 of FIGS. 16 and 19), except for the second semiconductor layer 228, on the base substrate 210a.

In the case where the semiconductor device of the present invention is driven in a forward direction, when a driving voltage is higher than an on-voltage of the Schottky diode, a current flows through an ohmic electrode and Schottky electrode part at the same time. Further, a current flow by the first ohmic electrode positioned below the Schottky electrode part even if the driving voltage is lower than the on-voltage of the Schottky diode. Therefore, in the semiconductor device, forward currents are increased, and thus it is possible to perform operation even at a low driving voltage.

When the semiconductor device of the present invention is driven in a reverse direction, a 2DEG is allowed to be disconnected by a depletion region generated by the Schottky electrode part to thereby stably block a current flow, which results in high reverse breakdown voltage.

In a method for manufacturing the semiconductor device, forward currents are increased and reverse leakage currents are reduced, so that it is possible to improve power converting efficiency of the semiconductor device, as well as operation speed of the semiconductor device.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. A semiconductor device comprising:
    a base substrate;
    a semiconductor layer disposed on the base substrate, the semiconductor layer comprising a lower layer adjacent to the base substrate, an upper layer having a lower impurity concentration than that of the lower layer, a second semiconductor layer which is disposed on the upper layer and has a higher impurity concentration than that of the upper layer, and protrusions protruded upward provided on the upper layer, the second semiconductor layer being disposed on the protrusions;
    an ohmic electrode part which has ohmic electrode lines disposed in a first direction, on the semiconductor layer; and
    a Schottky electrode part which is disposed to be spaced apart from the ohmic electrode lines on the semiconductor layer and includes Schottky electrode lines disposed in the first direction,
    wherein the Schottky electrode lines and the ohmic electrode lines are alternately disposed in parallel and the ohmic electrode part further includes first ohmic electrodes covered by the Schottky electrode lines on the semiconductor layer.

2. The semiconductor device of claim 1, wherein the ohmic electrode part further comprises an ohmic electrode plate connected to each one end of the ohmic electrode lines, and the Schottky electrode part further comprises a Schottky electrode plate connected to each one end of the Schottky electrode lines, and
    one of the Schottky electrode lines is disposed between two of the ohmic electrode lines to thereby achieve an interdigited configuration in which the ohmic electrode part and the Schottky electrode part are formed.

3. The semiconductor device of claim 1, wherein the first ohmic electrodes include a plurality of ohmic contact pillars with an island-shaped cross section, and
    the ohmic contact pillars are engaged with the Schottky electrode lines with one another up and down to thereby achieve a prominence and depression structure.

4. The semiconductor device of claim 3, wherein the ohmic electrode part further comprises first ohmic electrodes covered by the Schottky electrode lines on the semiconductor layer, and
    the first ohmic electrodes include ohmic contact pillars disposed in the first direction.

5. The semiconductor device of claim 1, wherein the Schottky electrode part comprises:
    first bonding portions bonded to the first ohmic electrodes, and
    second bonding portions bonded to the semiconductor layer of regions between the first ohmic electrodes and the ohmic electrode lines.

6. The semiconductor device of claim 1, further comprising field plates disposed on the semiconductor layer between the ohmic electrode lines and the Schottky electrode lines.

7. The semiconductor device of claim 6, wherein each of the field plates has one side portion covered by the ohmic electrode part and the other side portion covered by the Schottky electrode part.

* * * * *